United States Patent [19]
Budnaitis et al.

[11] Patent Number: 5,896,038
[45] Date of Patent: Apr. 20, 1999

[54] METHOD OF WAFER LEVEL BURN-IN

[75] Inventors: John J. Budnaitis; Jimmy Leong, both of Eau Claire, Wis.

[73] Assignee: W. L. Gore & Associates, Inc., Newark, Del.

[21] Appl. No.: 08/747,168

[22] Filed: Nov. 8, 1996

[51] Int. Cl.$^6$ .................................................. G01R 31/02
[52] U.S. Cl. ........................ 324/760; 324/754; 324/757
[58] Field of Search ............................... 324/754, 755, 324/757, 760, 765; 428/198; 439/66, 71, 74

[56] References Cited

U.S. PATENT DOCUMENTS

| | | | |
|---|---|---|---|
| Re. 26,837 | 3/1970 | Evans | 324/754 |
| 3,609,547 | 9/1971 | Slusser | 324/760 |
| 3,736,471 | 5/1973 | Donze et al. | 361/684 |
| 3,953,566 | 4/1976 | Gore | 264/288 |
| 4,133,592 | 1/1979 | Cobaugh et al. | 439/74 |
| 4,482,516 | 11/1984 | Bowman et al. | 264/127 |
| 4,530,779 | 7/1985 | Mayama et al. | 252/507 |
| 4,540,229 | 9/1985 | Madden | 439/325 |
| 4,654,248 | 3/1987 | Mohammed | 428/137 |
| 4,683,550 | 7/1987 | Jindrick et al. | 439/74 |
| 4,705,762 | 11/1987 | Ota et al. | 501/87 |
| 4,733,461 | 3/1988 | Nakano | 439/74 |
| 4,840,570 | 6/1989 | Mann, Jr. et al. | 439/74 |
| 4,963,225 | 10/1990 | Lehman-Lamer | 156/630 |
| 4,968,931 | 11/1990 | Littlebury et al. | 324/760 |
| 4,985,296 | 1/1991 | Mortimer, Jr. | 428/220 |
| 5,007,163 | 4/1991 | Pope et al. | 324/757 |
| 5,034,801 | 7/1991 | Fischer | 357/72 |
| 5,070,297 | 12/1991 | Kwon et al. | 324/754 |
| 5,100,740 | 3/1992 | Neugebauer et al. | 428/622 |
| 5,252,857 | 10/1993 | Kane et al. | 439/69 |
| 5,315,481 | 5/1994 | Smolley | 439/74 |
| 5,380,210 | 1/1995 | Gabbe et al. | 439/66 |
| 5,428,190 | 6/1995 | Stopperan | 174/261 |
| 5,437,556 | 8/1995 | Bargain et al. | 439/66 |
| 5,440,240 | 8/1995 | Wood et al. | 324/765 |
| 5,461,328 | 10/1995 | Devereaux et al. | 324/765 |
| 5,477,160 | 12/1995 | Love | 324/755 |
| 5,498,467 | 3/1996 | Meola | 428/198 |
| 5,532,610 | 7/1996 | Tsujide et al. | 324/757 |
| 5,541,524 | 7/1996 | Tuckerman et al. | 324/754 |
| 5,543,724 | 8/1996 | Christopher | 324/754 |
| 5,576,630 | 11/1996 | Fujita | 324/760 |
| 5,602,491 | 2/1997 | Vasquez et al. | 324/760 |
| 5,661,042 | 8/1997 | Fang et al. | 324/757 |
| 5,707,881 | 1/1998 | Lum | 34/754 |
| 5,731,073 | 3/1998 | Knott et al. | 428/198 |

FOREIGN PATENT DOCUMENTS 42 31 185  3/1993  Germany.

OTHER PUBLICATIONS

R. Bove, High Performance Contactor, pp. 2883, IBM Technical Disclosure Bulletin, vol. 18 No. 9, Feb. 1976.
Pending U.S. Patent Application Serial No. 08/724,393, filed Oct. 1, 1996, entitled "A Reusable, Selectively Conductive, Z–Axis, Elastomeric Composite Substrate".

*Primary Examiner*—Josie Ballato
*Assistant Examiner*—Russell M. Kobert
*Attorney, Agent, or Firm*—Victor M. Genco, Jr.

[57] ABSTRACT

The present invention relates to a system and method for performing reliability screening on semi-conductor wafers and particularly to a highly planar burn in apparatus and method for uses including wafer level burn-in (WLBI), diced die burn-in (DDBI), and packaged die burn-in (PDBI). The burn-in system includes a burn-in substrate with a planar base, a temporary Z-axis connecting member, and a Z-axis wafer level contact sheet electrically coupled to one another for screening wafers, diced die, and packaged electronic components, their assembly and use.

11 Claims, 20 Drawing Sheets

METHOD OF WAFER LEVEL BURN-IN

FIELD OF THE INVENTION

The present invention relates to a system and method for performing reliability screening on semi-conductor wafers and particularly to a highly planar burn in apparatus and method for uses including wafer level burn-in (WLBI), diced die burn-in (DDBI), and packaged die burn-in (PDBI). More specifically, the present invention relates to a burn-in system that includes a burn-in substrate with a planar base, a temporary Z-axis connecting member, and a Z-axis wafer level contact sheet electrically coupled to one another for screening wafers, diced die, and packaged electronic components, their assembly and use.

BACKGROUND OF THE INVENTION

Semiconductor manufacturers who make integrated circuit chips begin by manufacturing semiconductor wafers. Each wafer is typically 100 mm, 125 mm, 150 mm, 200 mm or 300 mm in diameter and contains anywhere from one to several thousand chips or die on the wafer. When manufacture of the wafer is completed, chips or die are cut or "diced" from the wafer and may later be mounted into single chip or multiple chip packages for implementation in a printed circuit board or other applications.

When manufacture of a wafer is completed, it is customary practice to test each chip on the wafer to determine whether each chip, as manufactured, electrically matches design criteria, matches performance criteria of the system in which the chip is to be implemented, and will be reliable in operation. If a chip fails electrical testing or reliability testing, the chip is not suitable for implementation in a system without repairing the chip or exercising redundancy features which may have been designed into the chip. Performance testing of chips may be used to speed sort chips into different categories suitable for different applications and sale at different prices.

Reliability testing is used to screen out chips having an undesirable short life span. Typically, a significant percentage of a group of chips will fail early in their lifetime due to marginal conditions during manufacture. Subsequently, a very low percentage of the group will fail during an extended period of use of the chips. Reliability screening of semiconductor chips is typically performed by a process of supplying test signal patterns to chips under test to repeatedly stimulate all devices and wires on a chip, and is typically performed at elevated temperatures to simulate the first six months of operation. Therefore, the screening procedure is known as burn-in.

Burning in chips tends to induce accelerated failures. Two examples of such failures are contamination induced failure at via interfaces, and gates and junctions, and in metal wires malformed during manufacture which may neck down to very thin regions on the order of 50% of the design width, which varies by technology and time but, is presently 0.35 µm. The metal in these necked down regions will tend to drift in the direction of electrical current flow by a mechanism known as electromigration, where the rate of drift is directly proportional to current density, accelerated by elevated temperature. Upon sufficient electromigration, an open circuit condition will occur in the necked down region of the metal and cause a logical failure of the chip for some test signal patterns. Gate oxide regions where transistors are formed using FET transistor technology are also a frequent source of reliability failure. The thickness of a gate oxide region of a transistor must be controlled within exacting tolerances. If the gate oxide region of one or more transistors on a chip, as manufactured, is too thin, the gate oxide may break down due to high electric fields within the transistor when test patterns are applied to the chip. Upon failure, output from the test patterns will evidence a failure.

While very valuable, the process of burn-in has historically been time consuming and expensive for semiconductor manufacturers. Existing burn-in is typically performed on integrated circuits at temperatures between 90° C. to 125° C., for anywhere between 24 to 168 hours. Obviously, this slow rate of reliability testing impedes volume production of functional semiconductors and adds tremendous cost.

Many manufacturers have attempted to address low throughput of known burn-in processes by creating burn-in boards onto which many diced chips are placed in chip packages, and then the packages go into sockets on the burn-in boards. Thereafter, each chip on the test board is simultaneously exercised with test patterns at elevated temperatures. Thus, many chips are burned-in at once. These systems effectively reduce the time required to burn-in a large volume of chips. However, the added cost of packaging defective or unreliable die is a significant shortcoming of such known burn-in processes.

Bare die burn-in (BDBI) is required to provide Known Good Die (KGD) determinations for multi-chip module's (MCM's) and other bare die applications, such as, chip-on-board (COB). Without bare die burn-in, yield of MCM's (and other bare die applications) is severely impaired, resulting in higher product costs. Current BDBI is typified by the Texas Instrument's "Die Mate"® product where a bare die is placed into a temporary package and the burn-in test is performed. The required alignment and handling steps in this procedure add cost, process complexity, and time to provide bare dies that will be reliable or "Known Good."

Another technique for improving throughput of the burn-in process is to perform burn-in on whole or parts of whole wafers containing undiced integrated circuits or chips. This process is known as wafer level burn-in (WLBI). In wafer level burn-in, electrical terminals from a test apparatus are brought into intimate contact with contact pads of one or more chips. It is therefore less destructive than soldering chips to a burn-in board. However, problems of planarity of electrical terminals of the test apparatus and with mismatch between the coefficient of thermal expansion of the test apparatus and the wafer under test exist.

These problems have been addressed to date by several different techniques. For example, the industry uses a material known as CIC which is a high pressure, high temperature, lamination of copper on the outside of an interior INVAR sheet. One of the drawbacks with this material is that the maximum thickness it can obtain is in sheets that are 62 mils thick. A second drawback is that when CIC is manufactured, it is rolled on a big spool. As a result, material from the outside of the spool to the inside of the spool has a different plastic deformation and hence radius of curvature.

Another drawback with the rolled CIC is that in order to get the desired thickness and planarity, four pieces of CIC must be laminated together. There must be an even number of CIC layers because two layers may be curved down and one may be curved up. This results in an over balance in one direction or the other. So the number of CIC sheets must be an even number—2, 4 or 6. The drawback of using so many sheets of CIC is that since CIC is very dense, the thicker the base, the heavier it becomes.

Another disadvantage of the CIC system is that, as manufactured, there is an individual piece of copper on both sides of the INVAR 36 going through a lamination process through rollers. The thickness of the copper top to bottom changes. As a result of the different thicknesses, stress differential warpage from top to bottom occurs, which is very detrimental during thermal excursions. The thickness of the CIC could change as you go through the process also. You cannot machine down the CIC to a uniform thickness because you may machine off more on one side than the other.

Another disadvantage of the CIC system is that the material having the highest coefficient of thermal expansion (CTE), the copper, is on the outside. Thus, greater stress is generated with CIC.

One technique that is used to contact a wafer employs electrical terminals, such as S shaped probes or Pogo® pins. With S shaped bendable wire probes, the test apparatus is brought into proximity of the wafer, and the S shaped probes are compressed back toward the test apparatus. The height of the test apparatus over the wafer can then be varied to ensure contact between each of the S shaped probes and contact pads on chips of the wafer, despite a lack of planarity of the test apparatus and/or the wafer. However, the S shaped probes are difficult to align to the contact pads of the chips on the wafer because they vary in X, Y displacement, as well as, in the Z direction on compression. Also, the number of pins used can be on the order of 20,000 to 40,000, or more, depending on the number of die per wafer and contacts per die, thereby increasing the likelihood of non-alignment and mismatched pins.

Pogo® pins suffer from shortcomings similar to the S-shaped probes. Although Pogo® pins are compressible, therefore compensating for some planarity differences between the burn-in substrate and the wafer under test, Pogo® pins present alignment challenges because the Pogo® pins must be put into a fixture to hold them in place. The mechanical tooling can have holes in slightly different locations due to normal tolerances.

Another technique for wafer level burn-in is described in U.S. Pat. No. 5,541,524 to Tuckerman et al. There is disclosed a process of creating a burn-in substrate having metallic contact pads that are coined. Subsequently, solder is formed on the top of the coins. The solder tops are then brought into contact with the chip pads during burn-in testing. Here, the solder tops may not be substantially planar, and must deform upon contact with the chip pads. Thus, in order to achieve contact between all of the solder tops and the chip pads, compressive forces must be applied which may damage some portion of the chip pads. Furthermore, the solder tops must be periodically reworked by melting them back to a hemisphere to ensure integrity of burn-in. However, this can only be used to test wafers smaller than the apparatus. Currently, the system can only test 150 mm wafers if the apparatus is manufactured on a 200 mm wafer, which does not provide a solution for testing 200 mm wafers.

Another technique for wafer level burn-in is described in U.S. Pat. No. 4,968,931 to Littlebury et al. There, a flexible membrane probe, having a plurality of contact pads, is compressed against a wafer having integrated circuits with mating chip pads. An inflatable bladder is positioned behind the flexible member probe to bring the probe contact pads into contact with the chip contact pads. However, the bladder can only compensate for gross irregularities in planarity. As the bladder inflates, the membrane is stretched moving the contact points. Thus, alignment is difficult. Also, only a limited number of traces can be implemented to bring signals from the wafer to the test electronics, limiting the complexity of the system severely. In addition, the system has a high coefficient of thermal expansion, resulting in positional variation during thermal aging.

Thus, there exists a need to provide a wafer level burn-in device which is highly planar and which is compliant, but at the same time maintains the structural integrity of the contacts of the device for contacting chip pads on a wafer. There is also a need for a burn-in system that eliminates the need for solder reflow or cleaning. There is also a need to provide a burn-in device having contacts, such as bumps, which are uniformly configured, precisely disposed, with a high degree of structural integrity for coupling the contacts of a wafer or the board under test. There further exists a need to provide a burn-in device with a base that has a low coefficient of thermal expansion matched to the wafer under test capable of successfully burning in large diameter wafers at elevated temperatures of up to 150° C., and as high as 200° C.

SUMMARY OF THE INVENTION

The present invention relates to a system and method for performing reliability screening on semi-conductor wafers that uses a highly planar burn-in apparatus. The burn-in apparatus includes a burn-in substrate unit with a high planarity base; a compliant, reusable, Z-axis member unit which can optionally include an elastomer; and a reusable Z-axis laminated wafer level contact sheet unit.

The burn-in substrate and wafer level contact sheet are electrically coupled to one another through the irregularly shaped conductive Z-axis pathways that extend through the thickness of the compliant, Z-axis member that is sandwiched therebetween. The Z-axis pathways are electrically isolated from one another in the X and Y axes directions.

A test signal from the burn-in substrate is conveyed to the component being screened through bumps on the lower surface of the wafer level contact sheet that are registered and in contact with the component being screened. Each bump at its upper end has a 4 to 8 mil pad and terminates in a tip that has a substantially planar configuration, and a surface diameter on the order of 0.25 mils and 2 mil (about 8 µm to 50 µm), and preferably 0.5 mils to 2 mil (about 12 µm to 50 µm). Thus, the pad dimension to tip dimension ratio is between 2:1 to 32:1, preferably between 4:1 to 32:1.

The laminated wafer level contact sheet unit has an upper and lower surface and includes a plurality of uniformly configured conductive bumps on its lower surface alignable with and corresponding to contact pads of an integrated circuit or other electronic component. The geometric configuration of the bump tip is sufficient to pierce an oxide layer that is formed on the contact pad of the semiconductor component. The laminated contact sheet further includes a plurality of contact pads on its upper surface, each individually electrically connected to a corresponding conductive bump through an open cell, porous layer having selective Z-axis conductivity.

The base unit has balancing layers disposed on an upper portion thereof and circuitry layer on a lower portion thereof. The base unit includes a degree of planarity that is less than 0.01 inches per linear foot, preferably 0.001 inches per linear foot. The balancing layer may include "dummy" layers to off-set and balance the circuitry layers. A plurality of first and second terminals form part of the circuitry layer, with the first terminals being coupled to a compliant, selectively conductive, Z-axis member, which may optionally contain an elastomer. The second terminals are connectable to a test signal generator and the first terminals.

The selectively Z-axis conductive compliant member is positioned between the lower surface of the base unit and the upper surface of the wafer level laminated contact sheet unit. The selectively conductive member comprises a planar, open cell, porous material having an X, Y and Z axis, with vertically defined cross-sectional areas electrically isolated in the X and Y axis directions. The cross-sectional areas extend from one side of the material to another side and are covered with conductive metal, thereby being capable of electrically coupling the first terminals to corresponding contact pads on the laminated wafer level contact sheet unit.

The selectively conductive member of the present invention may contain an elastomer in the porous material. When an elastomer is used in combination with the porous substrate, the temporary member is more reusable and less compliant than a Z-axis member lacking an elastomer.

Generally, the burn-in screening of electronic components includes positioning a burn-in unit in a temperature controlled environment, so that downwardly depending conductive bumps can be coupled to corresponding conductive pads of an electronic component to be screened. When the test signal is generated, it is conveyed through the burn-in unit to the conductive pads of the electronic component. The screening is usually conducted at a temperature of at least 90° C., preferably between 125° C. and 200° C., for 8 to 168 hours, preferably between 8 and 24 hours. The time of screening depends on th burn-in temperature, lower temperatures, longer burn-in time. Test signals are conveyed from said the terminal to the first terminals, a first set of Z-axis condcutive pathways, a second set of Z-axis conductive pathways through conductive bumps.

More specifically, the present invention provides a system for burn-in screening of electronic components, such as an integrated circuit or a semiconductor wafer, for example, where the wafer is contacted with a burn-in unit having a base member with a planarity of less than 0.01 inches per linear foot and a coefficient of thermal expansion that matches the coefficient of thermal expansion of the wafer, ±3 ppm. The generated test signal is conveyed through the burn-in unit to conductive pads on a wafer.

The present invention also relates to a burn-in screening procedure where conductive bumps of a high planarity burn-in system are coupled to conductive pads of an electronic component. The bumps have tips between about 10 µm to 50 µm in diameter.

Other objects, advantages and salient features of the invention will become apparent from the following detailed description, which taken in conjunction with the annexed drawings discloses the preferred, but non-limiting, embodiment of the invention.

DETAILED DESCRIPTION OF THE PRESENT INVENTION

The burn-in apparatus of the present invention includes: (1) a burn-in substrate unit with a high planarity base; (2) a compliant, reusable, Z-axis member unit, optionally containing an elastomer; and (3) a reusable, Z-axis laminated wafer level contact sheet unit, in a stacked array, and its assembly. The burn-in substrate unit, which contains circuitry layers on a lower portion or surface thereof, and the wafer level contact sheet are electrically coupled to one another when the compliant, reusable, Z-axis member unit is positioned therebetween.

Figure 1:
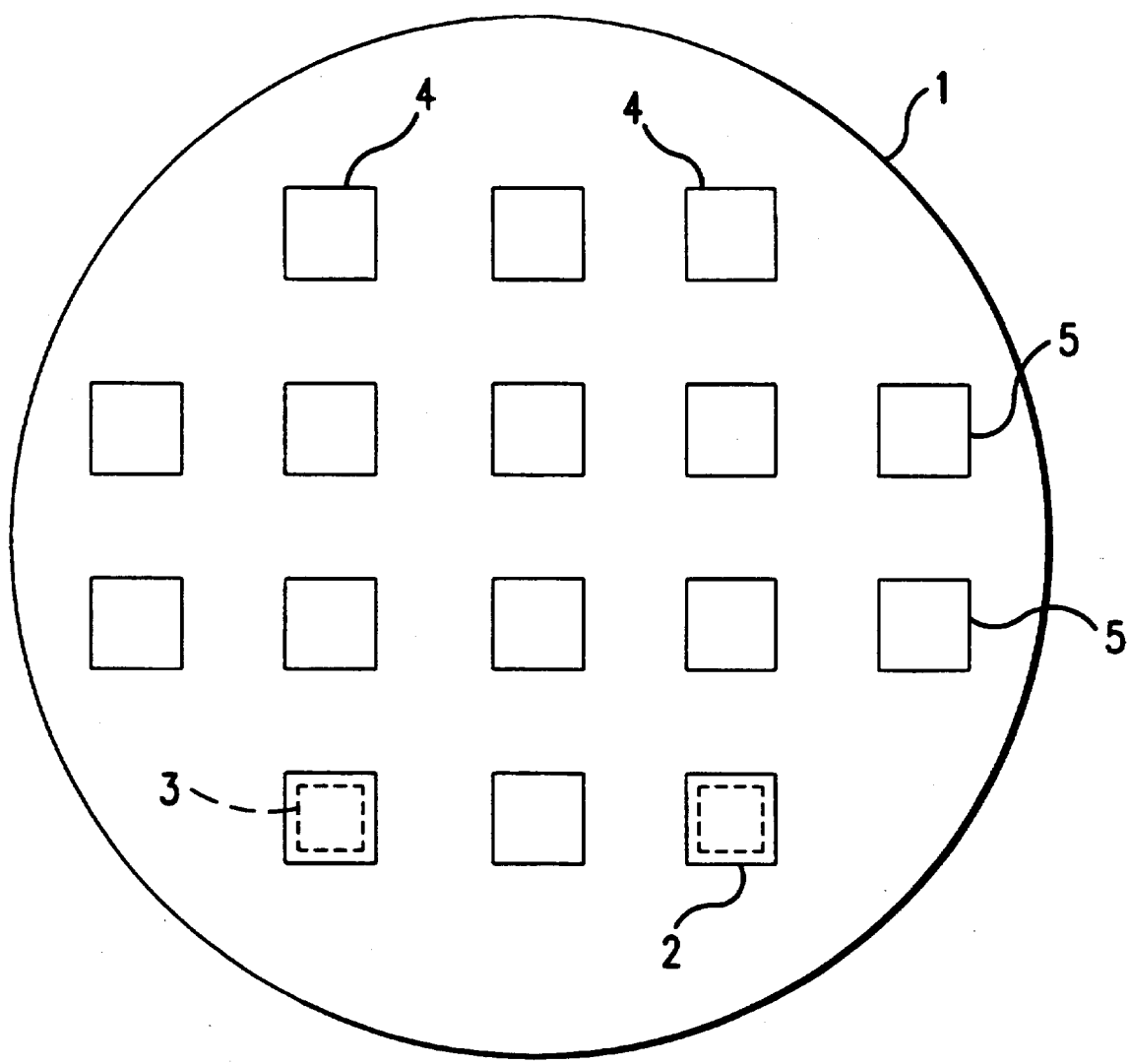
FIG. 1 depicts a wafer having a plurality of integrated circuit chips formed thereon, each chip including a pattern of contact pads for electrical connection to the chip.

In FIG. 1 a semiconductor wafer 1 is shown having a plurality of chips 2. The wafer 1 can be a silicon wafer or any other suitable material such as, germanium, silicon germanium, silicon carbide, gallium arsenide, selenium, tellurium, InSb, BP, CdS, ZnSe, ZnTe, PbS, InP, PbSe, PbTe, InAs, GaSb, ZnS and $Bi_2Te_3$. Each chip 2 on the wafer 1 has a plurality of contact pads 3 that are brought into electrical contact with the test apparatus to be described during testing. The chips 2 may be memory chips such as, but not limited to, dynamic random access memories (DRAMS), application specific integrated circuits (ASICS), analog chips, or any combination thereof. Chips 2 are typically arranged in columns 4, or rows 5 on the wafer so that upon completion of testing, the chips can be cut or "diced" from the wafer by sawing along the channels. Subsequently, diced chips are used in applications by packaging them in single chip modules (SCM), multi-chip module (MCM), or mounting them directly on a printed circuit board (COB).

Figure 2:
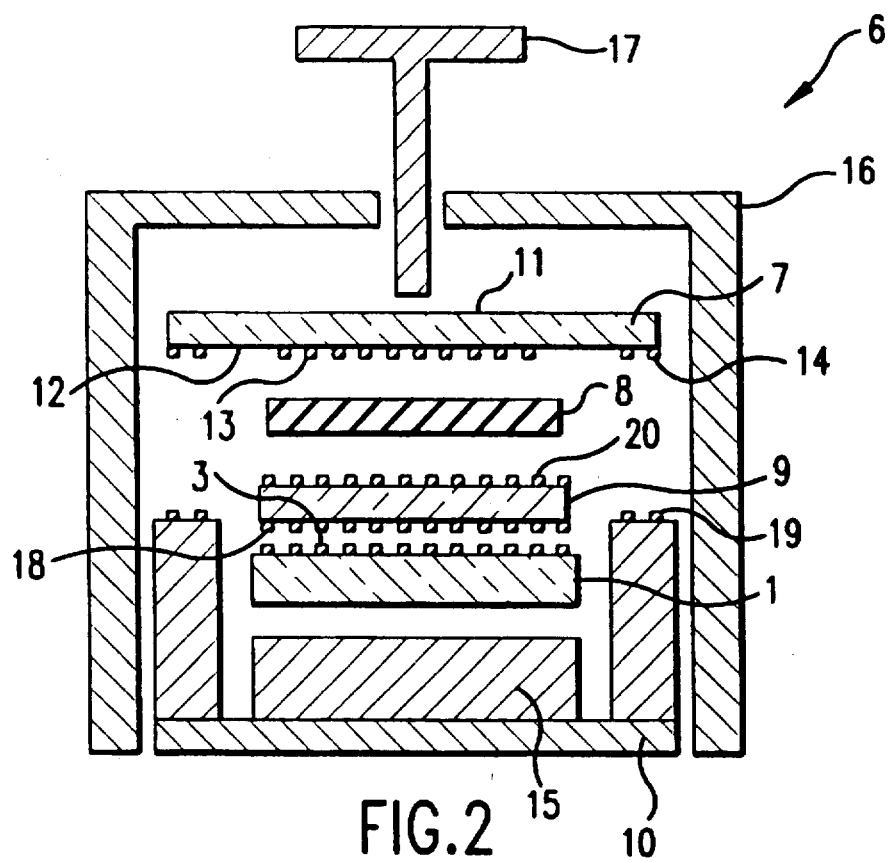
FIG. 2 depicts a burn-in device for wafer level burn-in with the conductive bumps of the laminated contact sheet raised prior to contacting the wafer.

The pretesting mode of the burn-in apparatus of the present invention is seen in FIG. 2. The burn-in apparatus 6 includes a base unit 7, a compliant, selectively conductive Z-axis member 8 which may contain an elastomer, a laminated wafer level contact sheet 9, a chuck 15 for receiving a semiconductor wafer 1, and a test signal generator 10. The base unit 7 has a highly planar structure and is positioned above the wafer 1, and extends beyond the edge or edges of the wafer 1.

The base unit includes an upper surface 11 and a lower surface 12. The lower surface 12 includes a plurality of first terminals 13 and second terminals 14. The first terminals 13 and second terminals 14 are electrically coupled together within the base unit 7.

The first terminals 13 are grouped in the center of the base unit 7, above the wafer 1 having a corresponding pattern to the pattern of contact pads of the chips 2 on the wafer 1. The second terminals 14 are also on the lower surface 12 of the base unit 7, and are grouped outside of the periphery of the first terminals 13. The second terminals 14 may form a ring around the first terminals 13, may be grouped substantially on one side of the first terminals, or may be distributed over the entire lower surface 12 of the base unit 7 outside of the grouping of the first terminals 13. The second terminals 14 are connectable to the test signal generator 10 at contacts 19.

Figure 34:
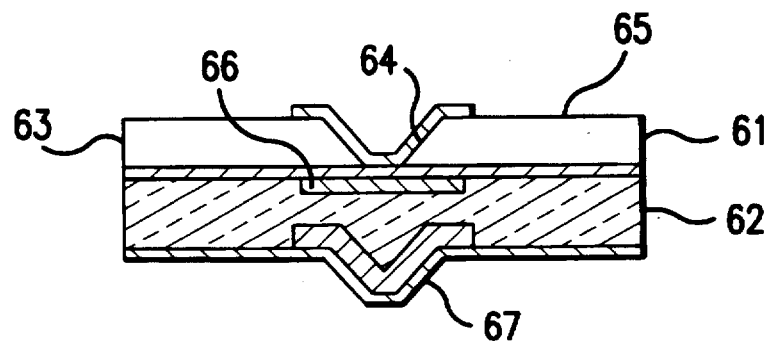
Figure 35:
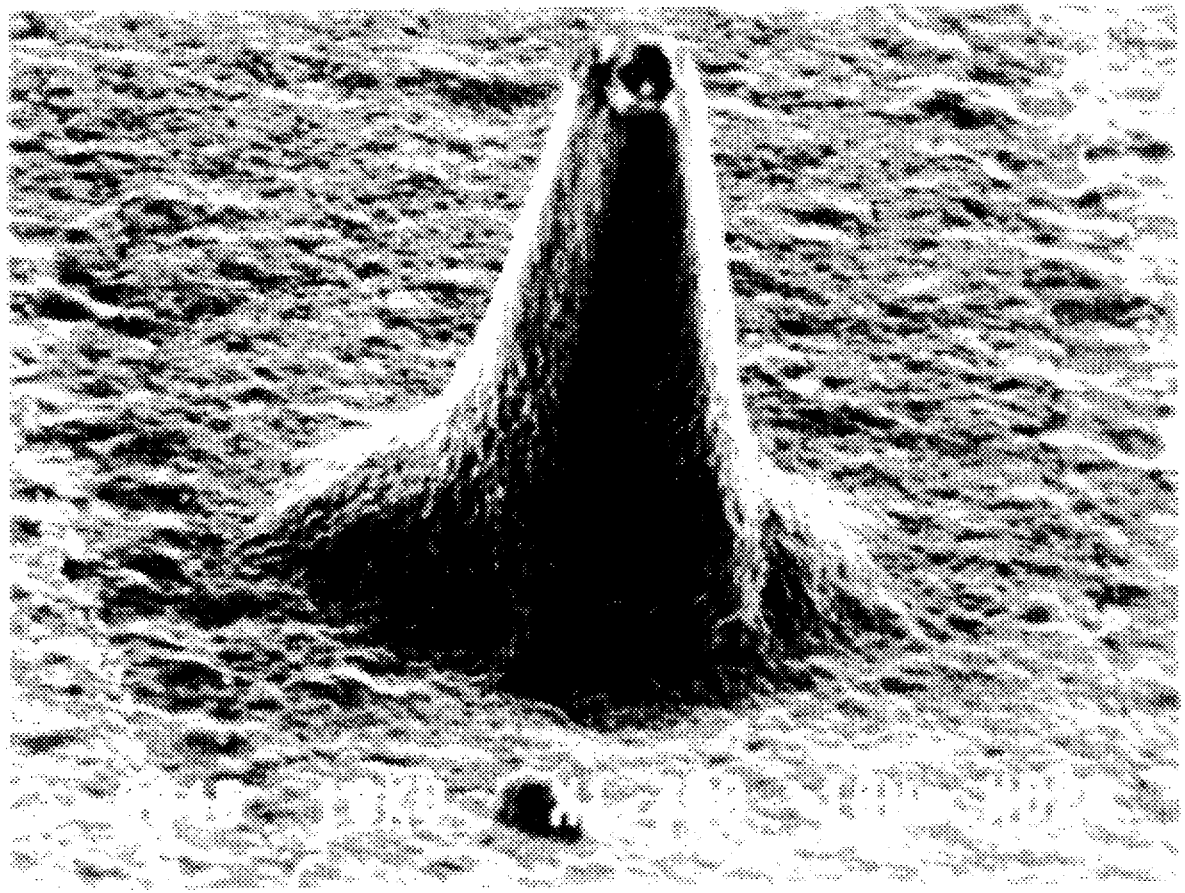
FIG. 35 is a scanning electron micrograph of a bump formed on the wafer level contact sheet of the present invention.

A jig 16 encompasses the burn-in system and includes a mechanism 17 that can apply pressure to base 7 to engage Z-axis material 8 and contact sheet 9 to have the bumps 18 thereon engage the pads of the wafer 1. The bumps are best seen in FIGS. 34 and 35.

Figure 3:
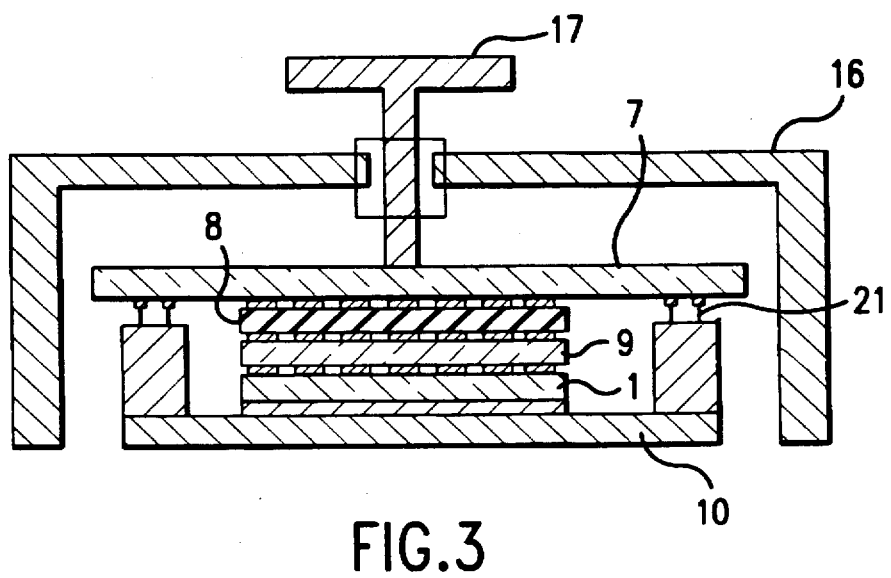
FIG. 3 depicts the burn-in device of FIG. 2 with the conductive bumps of the laminated contact sheet in intimate contact with the contact pads of the wafer.

As shown schematically in FIG. 3, the connection between terminals 14 and generator 10 may be accomplished by raised members terminating in a plurality of compressible pins 14, such as Pogo® pins or S shaped pins, on an upper surface 20. The compressible pins 21 are electrically coupled through the raised members to the test signal generator 10 and are arranged in a mating pattern to the pattern of second terminals 14 on the base unit 7.

The laminated wafer level contact sheet 9 of the present invention may be substantially the same size as the wafer 1 and has contact pads 20 arranged in a pattern corresponding to the first terminals 13 and the contact pads 3 on the wafer 1. The terminals 13 are contact pads which are formed from at least one metal layer, such as copper, nickel, gold, platinum, palladium or cobalt, with a layer thickness of between 1 µm and 50 µm, and dimensions of between 25 µm×25 µm and 250 µm×250 µm, and any desired shape.

The contact pads 20 on the surface of the laminated wafer level contact sheet 9 are aligned to the first terminals 13 on the base unit 7 and are temporarily attached to the lower surface of the base unit by the selectively conductive member 8. The selectively conductive member 8 provides electrical 20 contact between the first terminals 13 of the base unit 7 and the contact pads on the laminated wafer level contact sheet 9.

The wafer level contact sheet 9 also has raised bumps 18 on a lower surface thereof that terminate in a tip having a diameter of 0.25 to 2.0 mils. The raised bumps 18, best seen is FIGS. 34 and 35, are identified as reference numeral 67. The raised bumps 18 have a pattern corresponding to the contact pads 3 on the wafer 1 and are individually electrically coupled to the contact pads 20 on the upper surface of the laminated wafer level contact sheet 9, best seen in FIG. 34.

When a wafer 1 is place on the chuck 15, the wafer 1 is aligned so that the pattern of contact pads 3 on the wafer 1 corresponds to the pattern of raised bumps 18 on the laminated wafer level contact sheet 9. Alignment may be accomplished by any of several techniques, including optical alignment, infrared alignment, x-ray alignment, or mechanical alignment, such as, using pits formed on the wafer level contact sheet 9 which mate to protrusions on the wafer 1 (not shown). The wafer 1 may be held to the chuck 15 by a mechanical jig 16 and 17, by creating a vacuum (not shown) between the wafer 1 and the chuck 15, or by mechanical coupling.

FIG. 3 depicts the burn-in apparatus of FIG. 2, wherein the raised bumps 18 of the laminated wafer level contact sheet 9 have been brought into intimate contact with the contact pads 3 of the wafer 1. Also, the second to terminals 14 on the base unit 7 have been brought into contact with the compressible pins 21 on the test signal generator 10. Alternatively, contact may be made by a piston which pushes the raised bumps of the burn-in device against the contact pads 3 of the wafer 1 and the second terminals 14 against the compressible pins 21 of the test signal generator 10. Contact may be accomplished by creating a vacuum between the raised member of the test signal generator and the base unit.

A heating element (not shown) may be included within the chuck 15 for supplying heat to the wafer 1 in order to elevate the temperature of integrated circuits on the chips 2 under test to a desired burn-in temperature. In cases of high-power chips on the wafer, heat produced by the chips 2 under test may elevate the temperature of the integrated circuits above the desired burn-in temperature. In such a case, the wafer may be cooled by blowing cold air over the wafer, by including a cooling element in the chuck 15, or by many other known techniques. Alternatively, the entire jig may be located within a temperature controlled environment to provide the elevated temperatures for the burn-in procedures. Techniques for controlling temperature in semiconductor manufacturing and testing are well known.

Figure 4:
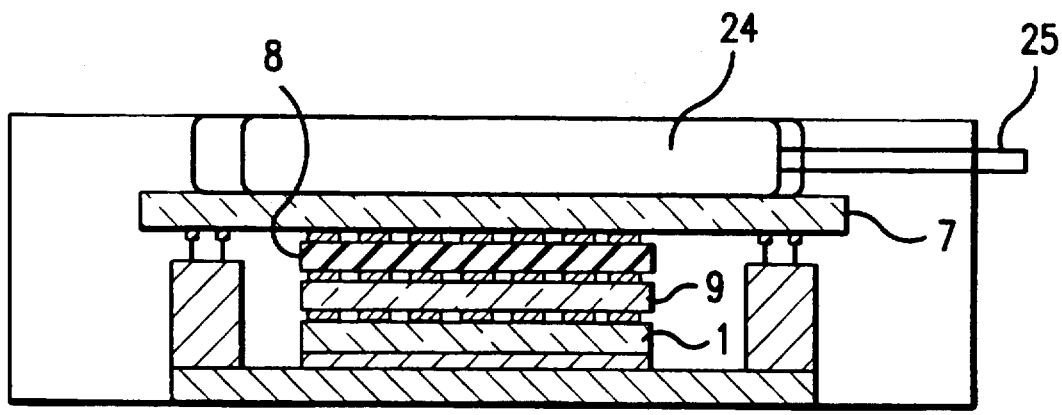
FIG. 4 depicts an alternate embodiment of a burn-in device, in which intimate contact between the laminated contact sheet and the wafer under test is controlled by an inflatable bladder.

FIG. 4 depicts an alternate embodiment of the invention, wherein compressive force applied to the burn-in device 6 is supplied by an inflatable bladder 24 having a source of fluid (not shown) through valve conduit 25. Inflation may be accomplished with liquid or a gas, and may tend to compensate for any tilting of the burn-in device relative to the wafer under test.

In an alternate embodiment of the invention, the test signal generator 10 may be coupled to the second terminals 14 by a variety of techniques, including by a rigid connector or flexible conductive tape. The second terminals 14 may be located on the surface 12 of the burn-in device, arranged in a pattern substantially contained within the area of the wafer 1 below. In this scenario, the burn-in device 6 itself might be no greater in size than the wafer itself.

BASE UNIT

Figure 5:
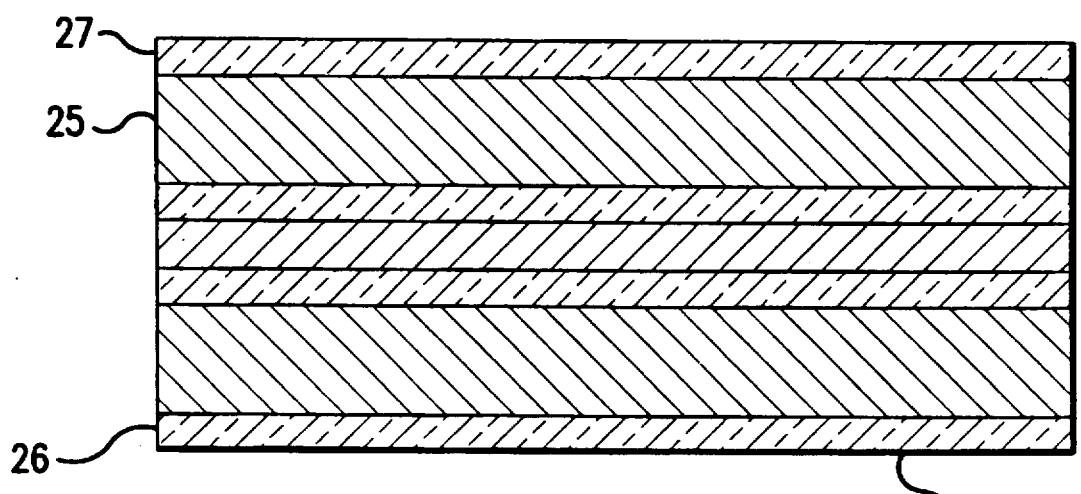
FIG. 5 depicts the base unit with upper balancing "dummy" layers and lower good "circuitry" layers according to the present invention.

The base unit is best seen in FIG. 5 and includes a high planarity base 25 formed from low coefficient of thermal expansion (CTE) material or having a matched composite CTE obtained through laminated layers of low and high CTE material. The base unit includes a stack of good circuitry layers 26, each layer includes a metal layer and a dielectric layer. Layer 27 of the base unit 7 includes dummy layers 27 which are used to balance circuitry layers 26. The lower surface 28 includes the first and second terminals 13 and 14.

Figure 6:
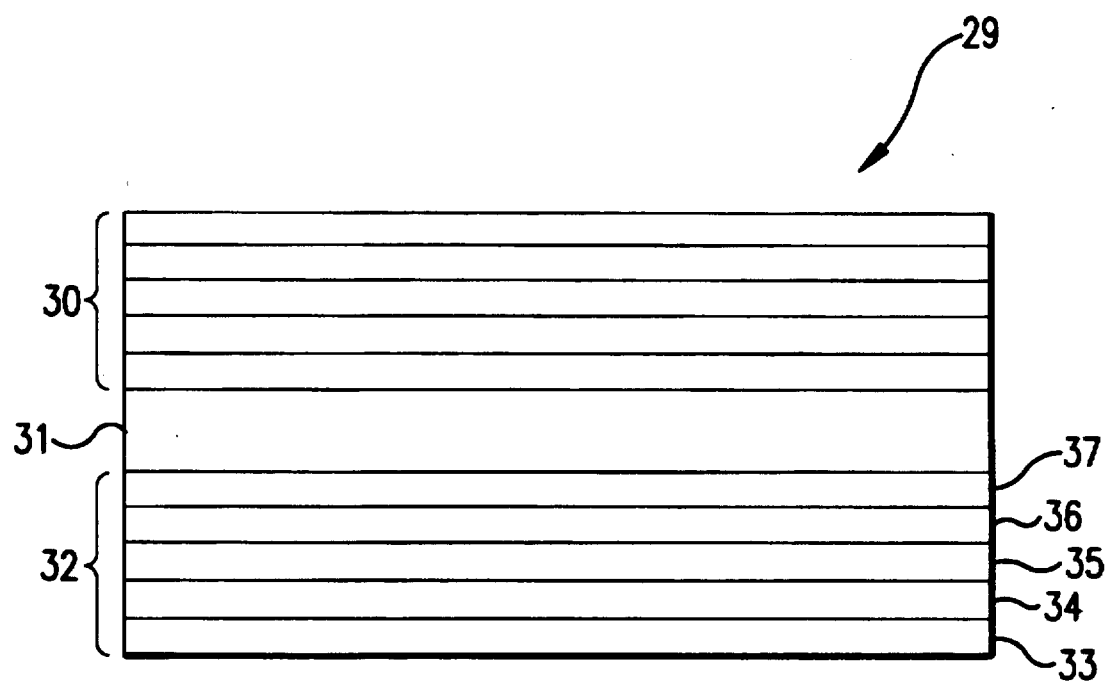
FIG. 6 depicts a base unit having signal layers, a low CTE base layer, and five balancing layers.

FIG. 6 depicts a base unit of the present invention which includes good circuitry layers 32, a low CTE base 31 or base 31 having a low composite CTE or matched CTE, and balancing layers 30. The base unit 29 has a pad layer 33, three signal layers 34, 36 and 37, a core layer 35, a low CTE base layer 31, and balancing layers 30. Layers 33-37 form the "good" circuitry layers 26 of base unit 29. Having three signal layers, 34, 36 and 37 facilitates routing a large number of signals between the first and second terminals 13 and 14 of the base unit 29. Positioning the core layer 35 between signal layers provides predictable impedance for signal traces on each of the signal layers 34, 36, 37 and reduces electrical noise within the base unit 29. The low-CTE base 31 constrains thermal expansion of the base unit 29 and contributes to maintaining high planarity of the base unit 29. Although the good layers 33-37 and balancing layer 30 have 5 layers, more or less layers are possible.

The balancing layers 30 are preferably as numerous as the number of "good" circuitry layers 26. The balancing layers should match the copper and dielectric density of the corresponding layers within the "good" circuitry layers 26 on the opposite side of the low-CTE base 31. Matching the density on opposing sides of the low CTE base 31 helps maintain the planarity of the base unit 29.

The balancing layers 30 may not contribute at all to the electrical performance of the base unit 29 and may be used entirely to maintain the planarity of the base unit 29. Therefore, the balancing layers 30 may be implemented with signal layers and core layers that have been scrapped due to manufacturing defects but which have a substantially similar density to corresponding "good" signal layers 34, 36, 37 and core layers 35 on the opposite side of the low-CTE base. However, the balancing layers could be additional "good" circuitization layers.

The core layer 35 is formed with a continuous sheet of conductive material laminated to a dielectriccopper, or one conductive material can be half-ounce copper, or one ounce copper. In place of copper, any metal having a high CTE could be used, such as, but not limited to, stainless steels, molybdenum, etc. The sheet of conductive material may be a substantially continuous plane, or the sheet of conductive material may be a mesh. The core layer 35 may be connected to the second terminals 14 and carry a voltage such as power or ground to decouple noise from signal traces 43 on signal layers 34, 36, 37 (shown in FIG. 8). Furthermore, the core layer 35 gives the signal traces 43 above or below a predictable impedance based on the dielectric constant of the dielectric, the geometry of the signal traces 43, and the height of signal traces 43 above or below the metal plane of the core layer 35. The core layer 35 may be pierced by vias 41 (shown in FIG. 7) allowing electrical coupling of signal layers 34, 36, 37 on opposite sides of the core layer 35. Furthermore, the core layer 35 may be coupled directly to the first terminals 13 on the pad layer 33 through vias 41 to supply power or ground to the wafer 1 under test.

In an alternate embodiment of the invention, the balancing layers 30 may be electrically incorporated into the base unit 29 by routing active signal traces on the balancing layers, and coupling the signal traces to the first and second terminals 13 and 14 by vias 41 through the low CTE base 31 or by a C-shaped flex circuit spanning the upper and lower surfaces of the base unit 29. Furthermore, the balancing layers 30 could support one or more active or passive circuits which facilitate the burn-in testing of wafers.

Figure 7:
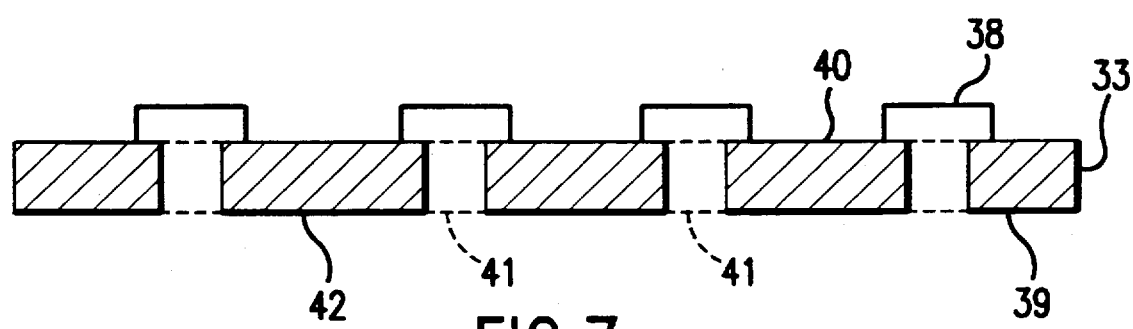
FIG. 7 depicts a cross-sectional view of the pad layer showing contact pads and via holes through a dielectric layer.

FIG. 7 depicts an inverted view of the pad layer 33. The pad layer 33 has electrically conductive contact pads 38 disposed against a dielectric layer 39. The contact pads 38 are dispersed across a surface 40 of the dielectric layer 39 of the pad layer 33 and implement the first and second terminals 13 and 14 of the base unit 7 or 29. Pads 38 may be raised above the surface of the dielectric, as shown, and may have any desired shape including circular, rectangular, conical, and trapezoidal. In one embodiment of the invention, the contact pads 38 are circular and made of a lower layer of copper with an outer coating of nickel or gold to resist corrosion and reduce contact resistance. However, the outer material may be any noble metal, such as, but not limited to, platinum or palladium. Similarly, the outer metal layer of contact pads 38 may also be any non-oxidative metal or metal alloy. The copper of the contact pads 38 is preferably formed from a base copper foil by a subtractive etch process well known in the art. Subsequently, an outer coating may be formed onto the copper using any technique including plating by an electrolytic or electroless process. Vias 41 are shown formed in the dielectric layer 39 of the pad layer 33 beneath the contact pads 38. Vias holes 41 may be formed in the dielectric layer 39 by many known techniques including drilling and laser ablation.

Generally, various ePTFE-based dielectric materials can be laser drilled using mode-locked solid states lasers operating in the UV range, and in particular, those capable of producing energy densities in the range of 0.5 to 20 J/cm$^2$ and those capable of making in-situ and virtually instantaneous changes in the energy density by varying the pulse repetition rate from 1000 to 10000 Hz. These variations in pulse repetition rate result in variations in the pulse width for ND:YAG lasers of between 40 and 100 ns. In general, when performing a post-pulse step to ablate dielectric residue after an initial ablation step, the pulse density can be double for a brief time period, whereby 1–10 pulses may typically.

In one embodiment of the present invention, the blind vias are formed with lasers that are solid state pulsed lasers such as the pulsed ND:YAG laser. The fundamental output from the ND:YAG laser is at a wavelength of 1064 nm. This wavelength is in the infrared portion of the electromagnetic spectrum. By installing beta-Barium Borate (BBO) crystals in the optical path harmonic generation facilitates the output of light at 355 nm (third harmonic) and 266 nm (fourth harmonic), which fall in the ultraviolet range.

The 355 nm and 266 nm wavelengths are particularly well suited for drilling vias in the laminated substrates of the present invention. The pulse length, energy density and number of pulses can be varied depending on the type of via being formed and the type of materials used in the laminated substrate.

For example, for drilling blind vias in a laminated substrate made of alternating layers of copper and an adhesive-filler-ePTFE dielectric, and using a 266 nm laser, the energy density is 1.5 J/cm$^2$, the energy per pulse is 10 μJ, and the power density is 20 megawatts per cm$^2$. At the 355 nm wavelength, blind vias are formed by setting the energy density at 3.5 J/cm$^2$, the energy per pulse is 30 μJ, and the power density is 35 megawatts per cm$^2$. The post-pulse step for the 355 nm blind via requires adjusting the conditions such that the energy density is 11 J/cm$^2$, the energy per pulse is 100 µJ, and the power density is 200 megawatts per cm$^2$.

When forming blind vias in the adhesive-filler-ePTFE dielectric, using the 355 nm laser, the energy density is 7 J/cm$^2$, the energy per pulse is 65 µJ, and the power density is 100 megawatts per cm$^2$. A post-pulse step would require adjusting the parameters such that the energy density is 11 J/cm$^2$, the energy per pulse is 100 µJ, and the power density is 200 megawatts per cm$^2$, be used.

The via holes 41 may then be plated with a metal, for example copper, to create a conductive path from the contact pads 38 on the upper surface 40 of the pad layer 33 to the lower surface 42 of the pad layer 33.

One or more signal layers, 34, 36, 37 is disposed above the pad layer 33. However, the pad layer 33 is optional and the contact pads 38 described as part of the pad layer 33 above may be implemented directly on the signal layer 34. The signal layers 34, 36, 37 comprise a plurality of conductive segments or signal traces 93 distributed across a dielectric layer as shown in FIG. 8.

Figure 8:
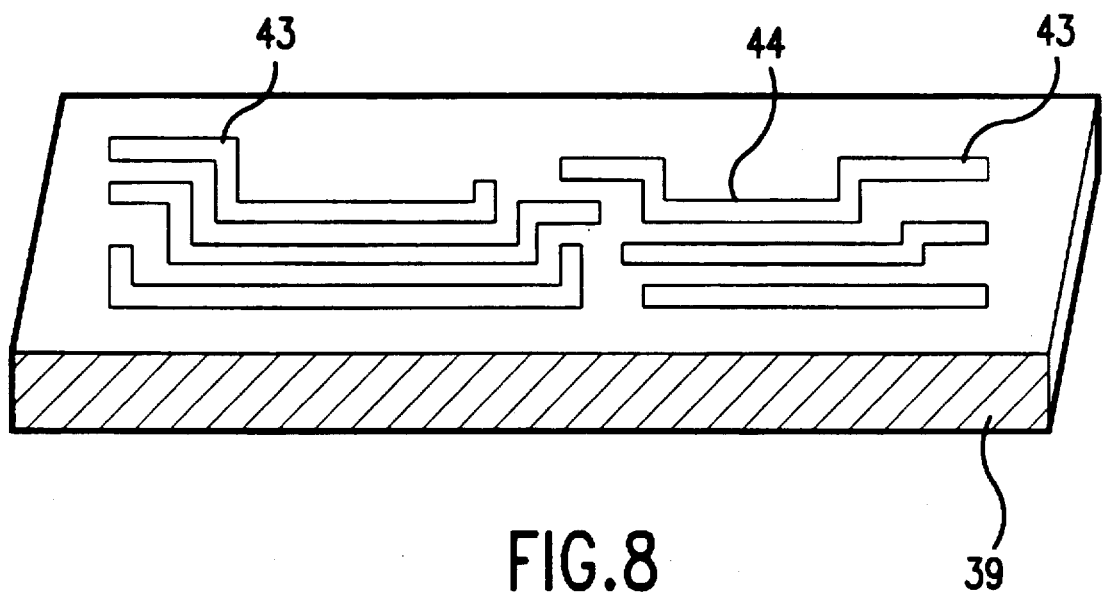
FIG. 8 depicts a view of a signal layer illustrating signal traces on a dielectric layer.

As seen in FIG. 8, the signal traces 43 create a conductive path 44 between the first terminals 13 and the second terminals 14 of the base unit 7 or 29. The signal traces 43 are typically and preferably copper, formed by a process of subtractive etching. A complete conductive path from the first terminals 13 to the second terminals 14 may be formed by creating a path from a first terminal 13, up through a via hole 91 (not shown) in the dielectric layer 39 of the pad layer 33 to a signal trace 93 on a signal layer, across the signal trace 93 of the signal layer to another via hole going down through the dielectric of the pad layer 33 to a corresponding second terminal 14. Similarly, first and second terminals 13 and 14 may be electrically connected by a more complex path of signal traces 43 and vias 41 spanning multiple signal layers.

Figure 9:
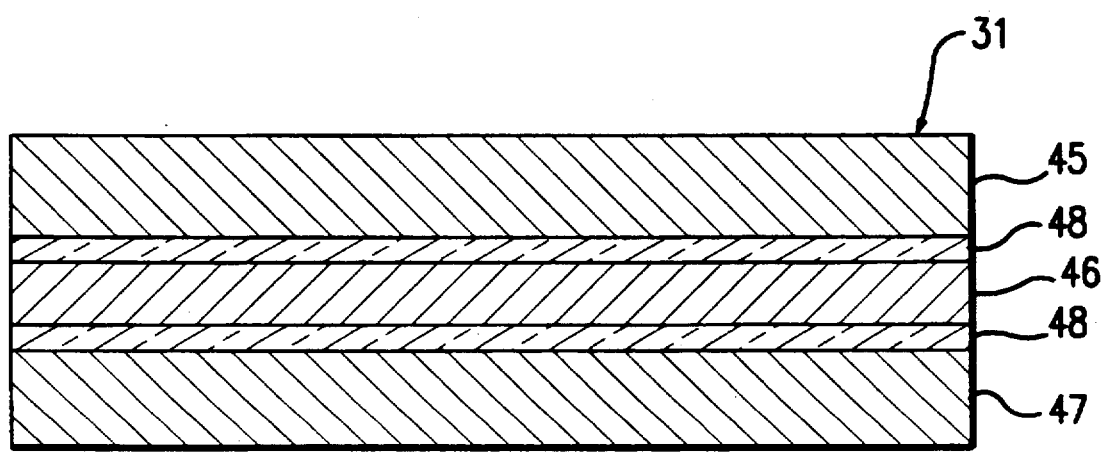
FIG. 9 depicts a cross-sectional view through the low CTE base layer illustrating its component layers.

FIG. 9 depicts the low CTE base 31 according to one embodiment of the invention. The base 31 is formed from a three ply stack of INVAR 36, copper and INVAR 36, respectively layers 45, 46 and 47. Instead of INVAR 36, a nickel and iron alloy containing between 30 wt. % and 42 wt. % nickel may also be used. Additionally, in place of INVAR 36 and layers 45 and 47, any low CTE material matched to the wafer unit test device, including but not limited to nickel alloys, may be used. The two nickel alloy sheets have a combined thickness $t_1$ and the copper sheet 46 has a thickness $t_2$, wherein a ratio $t_1$ to $t_2$ is chosen to match the coefficient of thermal expansion of a semiconductor wafer. The $t_1$ to $t_2$ ratio can be between 4:1 and 14:1, including, but not limited to ratios of 10:1, 11:1 and 12:1.

In one embodiment of the present invention, the nickel layers each have a thickness of approximately 115 mils, and the ratio of the nickel layers to the copper layer provides a coefficient of thermal expansion that matches a silicon wafer. However, the ratio of the nickel layer thickness, or other material thickness, to the copper layer thickness provides a coefficient of thermal expansion for the base that matches the coefficient of thermal expansion for a wafer formed from germanium, silicon germanium, silicon carbide, gallium arsenide, selenium and tellurium.

Nickel alloys have a low coefficient of thermal expansion, and therefore act to constrain the expansion of the base unit 31 relative to the wafer 1 as temperature increases. Preferably a fourteen inch square sheet of INVAR 36 and copper material are used. However, circular or rectangular sheets may be used. The sheets are between six and twenty inches in dimension, i.e., diameter or side length, such as, eight, twelve, fourteen, sixteen and twenty inches.

The INVAR 36 and sheets 45 and 47 are each preferably machined to approximately 115 mils thick with a degree of planarity between 0.020 and 0.0001 inches per linear foot, preferably between 0.01 and 0.0001 inches per linear foot. Most preferably, the degree of planarity is 0.001 inches per linear foot.

The copper layer 46 is approximately 21 mils thick and has a planarity of 0.0005 inches per linear foot. The copper layer comprises approximately 8% to 10%, e.g., 9.1%, of the total thickness of said metal or metal alloy layers and said copper layer.

The stack of INVAR 36, copper, and INVAR 36 is formed by laminating each piece of INVAR 36 to a surface of the copper using a dielectric 48, such as Speedboard® C, which is available from W. L. Gore and Associates, and which is described below. The dielectric layers of the low CTE base are between 25 µm and 250 µm thick.

Sheet thicknesses of 115 mils and 21 mils of the nickel alloy and copper sheets respectively are used in one embodiment, but any dimensions may be chosen, so long as the thickness of nickel alloy sheets is greater than the thickness of the copper.

DIELECTRIC

The dielectric materials used for the base unit and wafer level contact sheet of the present invention can be any high temperature dielectric material. For example, suitable dielectric materials include, but are not limited to polyimides and polyimide laminates, epoxy resins, organic materials, or dielectric materials comprised at least in part of polytetrafluoroethylene, with or without a filler, where once the adhesive has been impregnated, it has been partially cured and forms a B-stage material. Suitable materials include Speedboard® bond plies available from W. L. Gore and Associates, Inc. As should be understood, Speedboard® C does not contain a ceramic filler and is a prepreg of non-woven material containing a cyanate ester resin in a polytetrafluoroethylene matrix. Speedboard C® has a dielectric constant, (Dk) of about 2.6–2.7 at 1 MHz–10 GHZ, a loss tangent of 0.004 at 1 MHz–10 GHZ, a dielectric strength greater than 1000 V/mil, a glass transition and a $T_g$ of 220° C., a resin content of 66–68 wt. % and is available in a variety of thicknesses.

Other classes of dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 to Gore and 4,482,516 to Bowman, et al., each of which is incorporated herein by reference. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer.

Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, microporous cellulose acetate, can also be used.

The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles when analyzed by a Microtrak® Model FRA Partical Analyzer device, which displays a maximum particle size, a minimum particle size and an average particle size by way of a histogram.

Suitable fillers to be incorporated into the adhesive include, but are not limited to, $BaTiO_3$, $SiO_2$, $Al_2O_3$, ZnO, $ZrO_2$, $TiO_2$, precipitated and sol-gel ceramics, such as silica, titania and alumina, non-conductive carbon (carbon black) and mixtures thereof. Especially preferred fillers are $SiO_2$, $ZrO_2$, $TiO_2$ alone or incombination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by silylating agents and/or agents reactive to the adhesive matrix, such as by using coupling agents. Suitable coupling agents include, silanes, titanates, zirconates, and aluminates. Suitable silylating agents may include, but are not limited to, functional silyating agents, silazanes, silanols, siloxanes. Suitable silazanes, include, but are not limited to, hexamethyldisilazane (Huls H730) and hexamethylcyclotrisilazane, silylamides such as, bis(trimethylsilyl)acetamide (Huls B2500), silylureas such as trimethylsilylurea, and silylimidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT {tetrakis(2-ethyl-hexyl) titanate, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01-neopentyl(diallyl)oxy, trineodecanoyl zirconate, NZ-09-neopentyl(diallyl)oxy, tri(dodecyl) benzene-sulfonyl zirconate.

The aluminates that can be used in the present invention include, but are not limited to Kenrich®, diisobutyl(oleyl) acetoacetylaluminate (KA 301), diisopropyl(oleyl) acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

As used herein, Mean Flow Pore Size and minimum pore size were determined using the Coulter® Porometer II (Coulter Electronics Ltd., Luton UK) which reports the value directly. Average particle size and largest particle size were determined using a Microtrac light scattering particle size analyzer Model No. FRA (Microtrac Division of Leeds & Northup, North Wales, Pa., USA). The average particle size (APS) is defined as the value at which 50% of the particles are larger. The largest particle size (LPS) is defined as the largest detectable particle on a Microtrac histogram. Alternatively, the largest particle size is defined at the minimum point when the Microtrak FRA determines that 100% of the particulate have passed.

In general, the method for preparing the adhesive-filler delectirc involves:(a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, pressure feeding, the adhesive-filler paste into the highly porous scaffold, such as expanded polytetrafluoroethylene.

To prepare the filled adhesive film of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate. If the substrate is to be expanded polytetrafluoroethylene, then structures similar to those taught in U.S. Pat. No. 4,482,516 to Bowman, et al. are desirable. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer.

Alternatively, another mechanism for gauging relative pore and particle sizes may be calculated as the smallest pore size being not less than about 1.4 times the largest particle size.

Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Sample | Substrate Pore Size | | | Particle Size | | MFPS ÷ Part$_{Avg}$ | Pore$_{Min}$ ÷ Part$_{Max}$ | Pore$_{Min}$ ÷ Part$_{Avg}$ | Result |
|---|---|---|---|---|---|---|---|---|---|
| | Min (μm) | MFPS (μm) | Avg (μm) | Max (μm) | | | | | |
| A | 4 | 7 | 5 | 10 | | 1.4 | 0.4 | 0.8 | Poor |
| B | 4 | 5 | 5 | 10 | | 1.0 | 0.4 | 0.8 | Poor |
| C | — | 58 | 5 | 10 | | 12.4 | N/A | — | Good |
| D | 18 | 32 | 6 | 10 | | 5.3 | 1.8 | 3.0 | Good |
| E | 18 | 32 | 1 | 1 | | 32.0 | 18.0 | 18 | Good |
| F | 17 | 24 | 6 | 10 | | 4.0 | 1.7 | 2.8 | Good |
| G | 0.2 | 0.4 | 0.5 | 1.6 | | 0.8 | 0.125 | 0.4 | Poor |
| H | — | 60 | 18 | 30 | | 3.3 | — | — | Good |
| I | 14 | 11 | 0.5 | 1.6 | | 22.0 | 8.8 | 28 | Good |
| J | 14 | 29 | 4 | 8 | | 7.3 | 1.8 | 3.5 | Good |
| K | 14 | 29 | 5 | 10 | | 5.8 | 1.4 | 2.8 | Good |

EXAMPLE 1

A fine dispersion was prepared by mixing 281.6 g TiO$_2$ (T1 Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised of 57 weight percent TiO$_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

EXAMPLE 2

A fine dispersion was prepared by mixing 386 g SiO$_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent SiO$_2$, 5 weight percent PTFE and 42 weight percent adhesive, displayed good adhesion to copper, dielectric constant (at 10 GHz) of 3.3 and dissipation factor (at 10 GHz) of 0.005.

EXAMPLE 3

A fine dispersion was prepared by mixing 483 g SiO$_2$ (HW-11-89) into a manganese-catalyzed solution of 274.7 g bismaleimide triazine resin (BT206OBJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent SiO$_2$, 4 weight percent PTFE and 39 weight percent adhesive, displayed good adhesion to copper, dielectric constant (at 10 GHz) of 3.2 and dissipation factor (at 10 GHz) of 0.005.

EXAMPLE 4

A fine dispersion was prepared by mixing 15.44 kg TiO$_2$ powder (T1 Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" TiO$_2$-filled expanded PTFE (filled according to the teachings of Mortimer U.S. Pat. No. 4,985,296, except to 40% loading of TiO$_2$ and the membrane was not compressed at the end) was then dipped into the resin mixture, removed, and then dried at 165° C. for 1 min. under tension to afford a flexible composite. The partially cured adhesive composite thus produced comprised of 70 weight percent TiO$_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

EXAMPLE 5

A fine dispersion was prepared by mixing 7.35 kg SiO$_2$ (ADMATECHS SO-E2, Tatsumori LTD) with 7.35 kg MEK and 73.5 g of coupling agent, i.e.,3-glycidyloxypropyltrimethoxysilane (Dynasylan GLYMO (Petrach Systems). SO-E2 is described by the manufacture as having highly spherical silica having a particle diameter of 0.4 to 0.6 mm, a specific surface area of 4–8m²/g, a bulk density of 0.2–0.4 g/cc (loose).

To this dispersion was added 932 g of a 50% (w/w) solution of a cyanated phenolic resin, Primaset PT-30 (Lonza Corp.). In (MEK) methylethylketone, 896 g of a 50% (w/w) solution of RSL 1462 (Shell Resins, Inc.(CAS #25068-38-6)) in MEK, 380 g of a 50% (w/w) solution of BC-58 (Gre at Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.), and 2.40 kg MEK. This dispersion was subjected to ultrasonic agitation through a Misonies continuous flow cell for about 20 minutes at a rate of about 1–3 gal./minute. The fine dispersion thus obtained was further diluted to an overall bath concentration of 11.9% solids (w/w).

The fine dispersion was poured into an impregnation bath. A expanded polytetrafluoroethylene web having the node fibril structure of FIG. 5, and the following properties:

| Frazier | 20.55 |
| Coverage | 9 g/m² |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is placed taut in the measuring device and pressure a fixed by raising the web into contact with the ball of the burst probe. Pressure at break is recorded.

The web described above was passed through a constantly agitated impregnation bath at a speed at or about 3 ft./min, so as to insure uniformity. The impregnated web is immediately passed through a heated oven to remove all or nearly all the solvent, and is collected on a roll.

Several plies of this prepeg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 4 and Example 7 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |
| Shape | Spherical | Irregular, jagged |
| Surface area | 6–10 m²/g | 10 m²/g |
| Bulk Density | 0.47 g/cc | 1.12 g/cc |
| Specific Density | 2.26 g/cc | 2.16 g/cc |

EXAMPLE 6

An ePTFE matrix containing an impregnated adhesive filler mixture, based on $SiO_2$ prepared from the vapor combustion of molten silicon is prepared as follows. Two precursor mixtures were initially prepared. One being in the form of a slurry containing a silane treated silica similar to that of Example 5 and the other an uncatalyzed blend of the resin and other components.

Mixture I

The silica slurry is a 50/50 blend of the SO-E2 silica of Example 5 in MEK, where the silica contains a coated of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product is an MEK based mixture containing an uncatalyzed resin blend (the adhesive) contains approximately 60% solids, where the solid portion is an exact mixture of 41.2% PT-30 cyanated phenolic resin, 39.5% RSL 1462 epoxy resin, 16.7% BC58 flame retardant, 1.5% Irganox 1010 stabilizer, and 1% bisphenof A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level is 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 515 solids content, 23.48 pounds of mixture I. Then mixture II was added to the container to provide 5.64 pounds of solids, e.g., 59.6% solids, 9.46 pounds of mixture II. The manganese catalyst solution (0.6% in mineral spirits), 3.45 grams, was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix was impregnated with this bath mixture to form a dielectric material.

EXAMPLE 7

A fine dispersion was prepared by mixing 26.8 grams Furnace Black (Special Schwarz 100, Degussa Corp., Ridgefield Park, N.J.) and 79 grams of coupling agent (Dynasian GLYMO CAS #2530-83-8; 3-glycidyloxypropyl-trimethoxysilane (Petrach Systems). The dispersion was subjected to ultrasonic agitation for 1 minute, then added to a stirring dispersion of 17.5 pounds $SiO_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w/) mixture of RSL 1462 in MEK, 1495 grams of a 53.2% (w/w) solution of BC58(Great Lakes, Inc.) in MEK, 200 grams of 23.9% (w/w) solution of bisphenot A (Aldrich Company) in MEK, 71.5 grams lrganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 of the adhesive varnish described above and 38.3 pounds MEK. This mixture was poured into an impregnation bath, and an ePTFE web was passed through the impregnation bath at a speed at or about 3 ft/min. This dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperatures of 200° C. for 90 minutes then cooled under pressure. This resulting dielectric displayed good adhesion to copper.

EXAMPLE 8

An adhesive varnish was prepared by adding the following: 3413 grams of a 57.5% (w/w) solution of Primaset PT-30 (PMN P-88-1591)) in MEK, 2456 grams of a 76.8% (w/w) solution of RSL 1462 in MEK, 1495 grams of a 53.2% (w/w) solution of BC58(Great Lakes, Inc.) in MEK, 200 grams of 23.9% (w/w) solution of bisphenol A (Aldrich Company) in MEK, 71.5 grams lrganox 1010, 3.21 grams of a 0.6% (w/w) solution of Mn HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams $SiO_2$ (SO-E2). This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperature of 220° C. for 90 minutes then cooled under pressure. This resulting dielectric displayed good adhesion to copper.

The low CTE base of FIG. 9 was prepared using the dielectric material of Example 6. A copper core was laminated on each side thereof with a layer of the filled ePTFE of FIG. 9. Thereafter, INVAR 36 is placed on each exposed side of the dielectric material. The composite is heated under pressure to form the base unit 31.

As discussed above with reference to FIGS. 1 and 2, a Z-axis material is used for components 2 and 9. The selectively conductive Z-axis substrate member is reusable and compliant. As taught in U.S. Pat. No. 5,498,467 to Meola, the basic substrate is a planar, open cell, porous material lying in a plane defined by an x and a y-axis, and having Z-axis pathways extending from one side of the material to the other side. When the Z-axis material includes an optional elastomer, it is positioned between the lower surface 12 of the base unit 7 and the upper surface of the laminated wafer level contact sheet 9. The selectively conductive member 8, having the optional elastomer, has a series of electrically isolated, irregularly shaped electrically conductive pathways extending from a lower surface of the selectively conductive member to an upper surface generally in the direction of the Z-axis. When in place between the base unit 7 and the laminated wafer level contact sheet 9, the electrically conductive pathways electrically couple the first terminals 13 of the base unit 7 to the contact pads 20 on the upper surface of the laminated wafer level contact sheet 9.

When the Z-axis material is used to form the laminated wafer level contact sheet 9, to be described hereinafter, it contains an bonding adhesive which is in the partially cured, B-stage. However, because it is in contact with the Z-axis material 8, is may be readily detached therefrom and be reused to attach another wafer level contact sheet 9.

Suitable materials for the Z-axis member, which can be used for both the material 8 and laminated wafer level contact sheet 9, have a thickness on the order of $5 \times 10^{-6}$m and $5 \times 10^{-4}$m (5 µm and 500 µm), e.g. 50 µm, 75µ, 100 µm, 150 µm etc., and include woven or non-woven fabric, such as a nylon, glass fiber or polyester fabric or cotton, or the like. The member can also be a porous polymeric material or membrane, that is flexible, such as porous polyolefins, e.g., porous polyethylene, porous polypropylene, porous fluoropolymers, or open cell, porous polyurethanes. Additionally, open cell, porous inorganic materials, such as thin porous ceramic plates that have continuous pores from one side to the other can be used.

Porous fluoropolymers include, but are not limited to, porous polytetrafluoroethylene (PTFE), porous expanded polytetrafluoroethylene (ePTFE), porous copolymers of polytetrafluoroethylene and polyesters or polystyrenes, copolymers of tetrafluoroethylene and fluorinated ethylene propylene (FEP) or perfluoroalkoxy -tetrafluoroethylene (PFA) with a $C_1$–$C_4$ alkoxy group. Porous materials include expanded polypropylene, porous polyethylene and porous polytetrafluoroethylene.

The material used as the substrate for the Z-axis material is expanded polytetrafluoroethylene having a microstructure of nodes interconnected with fibrils, a void volume of about 20% to 90%, such as the material prepared in accordance with the teachings of U.S. Pat. No. 3,953,566, incorporated herein by reference, exemplified by the ePTFE of FIG. 11.

A planar porous material that is used as the Z-axis substrate has a thickness of between about 5 and 125 μm, but thickness is not a critical factor so long as the ultra-violet strength used to form the conductive pathways will penetrate the sample.

Figure 10:
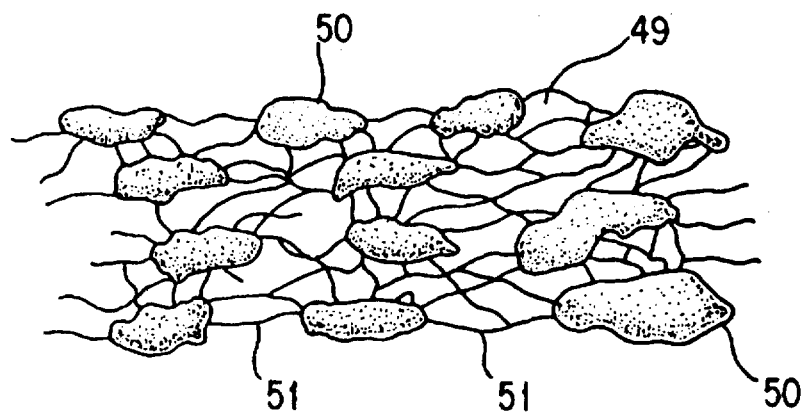
FIGS. 10–12 schematically show the formation of irregular Z-axis pathways extending through an open cell, porous substrate.

With reference to FIGS. 10–13, when the material for forming the Z-axis member is microporous PTFE (expanded polytetrafluoroethylene), the pores 49 are defined as the space between nodes 50 interconnected with fibrils 51, as shown in FIG. 10. In this case, the internal structure of nodes 50 interconnected with fibrils 51 is of a material density that results in an irregular continuous path 52 through the Z axis within a vertically defined cross section of the Z axis from one side of the planar member to the other (see FIG. 13).

The selectively conductive member 53 (FIG. 13) is prepared by making areas 32 (FIG. 12) through the Z-axis direction receptive to deposition of a metal salt, which metal salt on exposure to radiant energy is converted to nonconductive metal nuclei which then act to catalyze deposition of a conductive metal from an electroless metal deposition solution. The pores 49 of a porous member, defined above, are first wetted with a wetting agent, such as an alcohol, or organic aqueous surfactant. Methanol, propanol tetrafluoroethylene/vinyl alcohol copolymers or the like may be used. The wetting agent acts to make the material of the member receptive to conductive metals such as nickel or copper.

A radiation sensitive metal salt composition is a liquid radiation sensitive composition comprising a solution of a light sensitive reducing agent, a metal salt, a source of halide ions, and a second reducing agent. Preferably, the radiation sensitive solution contains water, the metal salt, a light sensitive reducing agent, a second reducing agent, and optionally (for hard to wet surfaces) a surfactant. The metal salt includes but is not limited to, copper acetate, copper formate, copper bromide, copper sulfate, copper chloride, nickel chloride, nickel sulfate, nickel bromide, ferrous bearing compounds, such as, ferrous sulfate, ferrous chloride, and noble metals such as palladium, platinum, silver, gold and rhodium.

Suitable light-sensitive reducing agents are aromatic diazo compounds, iron salts, e.g., ferrous or ferric oxalate, ferric ammonium sulfate, dichromates e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride or compounds of silver, palladium, gold, mercury, cobalt, nickel, zinc, iron, etc., the latter group optionally being added in amounts of 1 mg to 2 grams per liter.

The second reducing agents, include, but are not limited to, polyhydroxy alcohols, such as glycerol, ethylene glycol, pentaerythritol, mesoerythritol, 1,3-propanediol, sorbitol, mannitol, propylene glycol, 1,2-butanediol, pinacol, sucrose, dextrin, and compounds such as triethanolamine, propylene oxide, polyethylene glycols, lactose, starch, ethylene oxide and gelatin. Compounds which are also useful as secondary reducing agents are aldehydes, such as formaldehyde, benzaldehyde, acetaldehyde, n-butyraldehyde, polyamides, such as nylon, albumin and gelatin; leuco bases of triphenyl methane dyes, such as 4-dimethylaminotriphenylmethane, 4',4',4"-tri-dimethylamino-triphenylmethane; leuco bases of xanthene dyes, such as 3,6-bis dimethylamino xanthene and 3,6-bis dimethylamino-9-(2-carboxyethyl) xanthene; polyethers, such as ethylene glycol diethyl ether, diethylene glycol, diethyl ether tetraethylene glycol dimethyl ether, and the like.

A second reducing agent that is also a humectant, exemplified by sorbitol, as a constituent of the treating solution, for the humectant, apparently by reason of a moisture conditioning effect on the "dry" coating prior to developing. It provides substantial aid in maintaining density of the metal coating on the internal material of the member during a developing step in which any unconverted radiation-sensitive composition in the coating is washed off of the base.

Among the suitable surfactants are polyethenoxy nonionic ethers, such as Triton X-100, manufactured by Rohm & Haas Co., and nonionic surfactants based on the reaction between nonyl phenol and glycidol, such as Surfactants 6G and 10G manufactured by Olin Mathieson Company.

This treating solution, i.e., the radiation sensitive composition, contains an acidifying agent in the form of an acid salt for adjusting the pH of the aqueous solution to usually between about 2.0 and 4.0 (preferably 2.5 to 3.8) and a small quantity of halide ions (iodide, bromide or chloride ions), so that a combination of additives provides a surprising effect in substantially intensifying the density of the coating that is formed subsequently by exposure of the treated planar material to radiant energy. Adjusting the acidity does not always require introducing an agent for that purpose alone, because the adjustment may be accomplished wholly or partially by means of an acidic substance that has other functions also, as exemplified by a light-sensitive reducing agent of an acidic nature (e.g., ascorbic acid, glycerin, etc.) or by some additives for introducing halide ions (e.g., hydrochloric acid). Similarly, some or all of the halide ions may be introduced as components of the reducible metal salt (e.g., cupric chloride).

Among the many suitable acidic substances which may be employed in controlling or adjusting the pH of the sensitizing solution are fluoroboric acid, citric acid, lactic acid, phosphoric acid, sulfuric acid, acetic acid, formic acid, boric acid, hydrochloric acid, nitric acid and the like. A wide variety of bromide, chloride and iodide salt and other halide-generating water soluble compounds may be utilized to provide part or all of the desired halide ion content of the treating solution. These may include, inter alia, salts of metals in general and these halogens as exemplified by cupric bromide, nickel chloride, cobalt chloride, cupric chloride, sodium iodide, potassium iodide, lithium chloride, magnesium iodide, magnesium bromide, sodium bromide, potassium bromide, and the like. Bromide salts are suitable, as they produce a higher degree of sensitivity (i.e., darker and denser deposits) on the substrate than the corresponding chloride in at least certain instances.

The halide ions constitute only a minor proportion of the solute and may typically range from about 0.045 to 1.6%, preferably about 0.13 to 0.45%, based on the total weight of dissolved solids. The amount of halogen may be stated otherwise as between about 0.9 and 25 milli-equivalents of halogen per liter of the sensitizing solution, preferably about 2.5 to 9 milliequivalents, e.g., 0.3–1.0 gm/l for cupric bromide. Increasing the proportions of the halide ions is usually undesirable as such increases appear to gradually diminish the sensitizing effect of the treatment below what is obtainable with the optimum amount. Also, the proportion of these halide ions expressed as equivalents is less than that of the cupric or other reducible non-noble metal cations in the treating solution. For instance, the ratio of equivalents of such metal ions to halide ions is usually in the range of at least 2:1 and preferably about 4:1 to 100:1.

The radiation sensitive composition is applied to the material to thoroughly wet the material defining the pores whereby the porous member is subjected to the radiation sensitive composition for a time sufficient for the composition to permeate or penetrate through the pores of the material and form a coating on the pore interior along the material defining the pores from one side of the porous planar material to the other. Thereafter the coating porous member is dried by air drying or oven baking at below 50° C. At this stage, to preserve the light-sensitive nature of the treating compositions, the material should be processed under yellow light conditions. The member should also be kept at a temperature less than 70 F. and at no greater than 60% relative humidity because of possible absorption of water by the material of the member which can adversely affect the process.

The surface of one side of the coated porous member is masked with an opaque cover 55 (FIG. 11) in selected areas so that subsequent radiation will not strike the covered area. The masking can result in dot shaped conductive areas of any desired, shape, size, array or alternating bands or strips of conductive areas through the Z axis direction, separated by alternating bands of nonconductive areas (electrically isolating), for use as an electrical connector. The dots are conventionally circulator, but could have other geometrical configurations, as squares, rectangles, etc. The size of the dot can be as small as a 0.0001 inches and as large as 0.025 inches, preferably 0.001 inches, 0.002 inches, 0.003 inches, 0.004 inches, 0.005 inches, 0.008 inches, 0.009 inches or fraction thereof where the pitch, defined as the distance between the centers of adjacent dots is preferably at least twice the dimension of the dots, e.g., 1 mil dot, 2 mil pitch.

Figure 11:
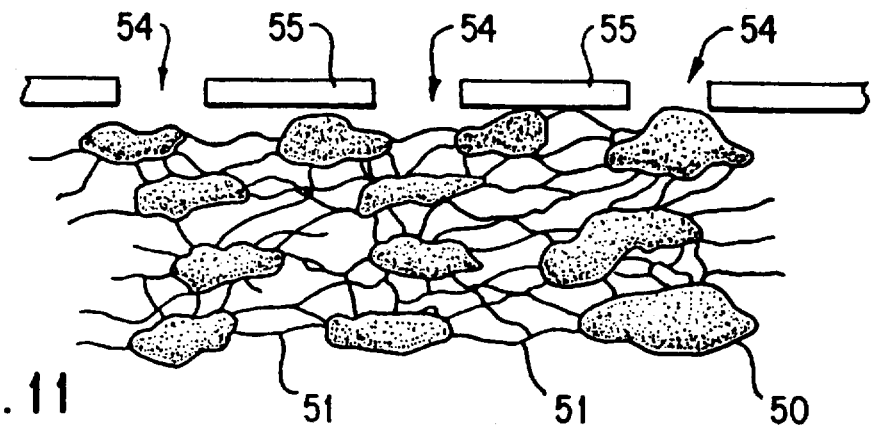
Figure 12:
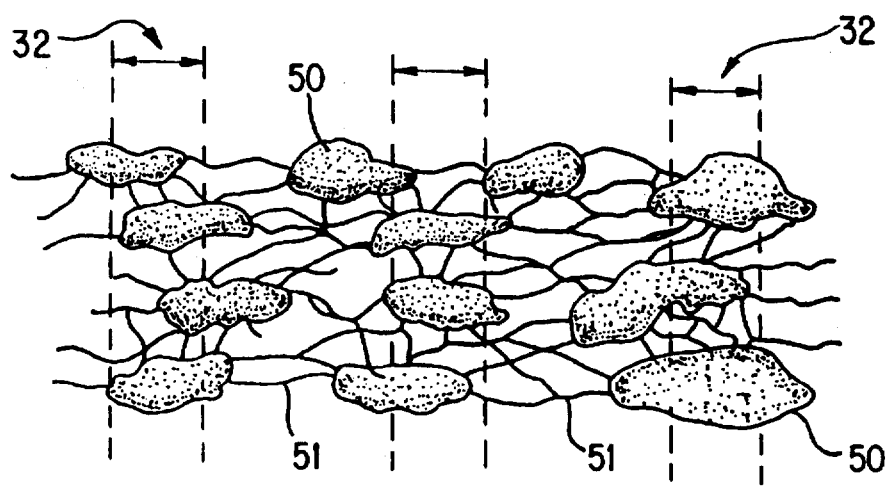
Figure 13:
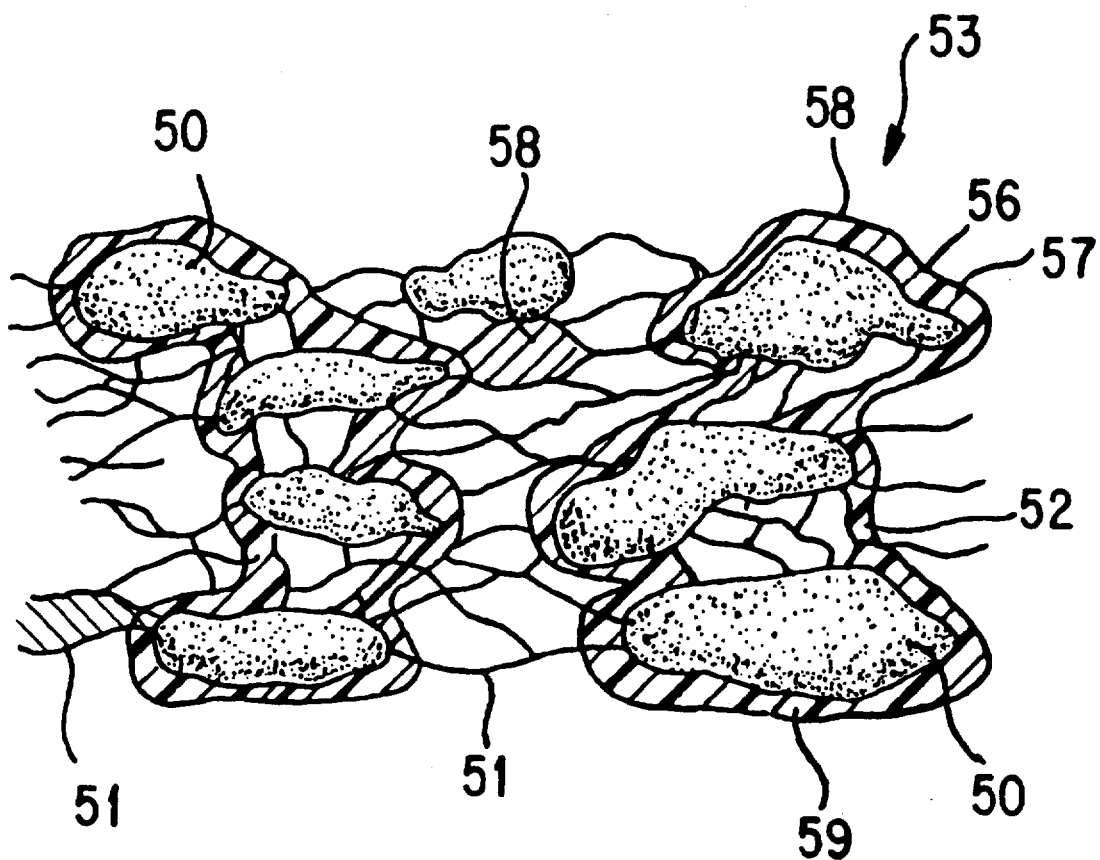
FIG. 13 depicts a porous substrate having isolated, Z-axis conductive pathways extending through the thickness of the substrate and terminating in conductive surface contacts.

The masked member of FIG. 11 is exposed to radiation, such as light, electron beams, x-ray, and the like, preferably ultraviolet radiation, for a time and at a power sufficient to reduce the metallic cations in the metal salt to metal nuclei throughout the thickness of the member. The member is then unmasked and washed with an acidic or alkaline washing solution to wash off the radiation sensitive composition that had been protected by the opaque cover. The acidic or alkaline washing (or fixing) solution does not affect the areas where the radiation had reduced the metal cations to metal nuclei, if the solution is not left in contact with the areas for more than a few minutes, e.g., 5 minutes or less.

Specifically, the treated member is selectively masked with a metallic mask, diazo or silver halide film, as shown in FIG. 11. The masked member is then photo imaged with either a non-collimated or collimated ultra-violet light source of less than 500 manometers wavelength. The catalyst, the nonconductive metal nuclei, itself requires a minimum of 200 millijoules radiant energy to establish a stable photo image.

The UV light energy is strong enough to penetrate through the thickness of the porous member. Thus, in subsequent plating operations, the conductive metal plates continuously through the Z-axis and provides electrical continuity in the Z-axis. If desired, the UV light energy can be applied to both sides of the planar member.

After a 5 minute normalization period, the catalyzed material is then washed for a short period of 30–90 seconds in a sulfuric acid solution, e.g. a solution consisting of 8% sulfuric acid by weight and 92% deionized water by weight or an alkaline solution consisting of 40 g/l of ethylene diamine tetraacetic acid, 100 ml/l of formaldehyde, adjusted at a pH of greater than 10 with sodium hydroxide. The purpose of this washing step is to eliminate the unexposed catalyst from the material while retaining the photo-reduced image.

The washed material containing the selective image is next stabilized with a reactive metal cation replacement solution. A convenient solution is:

| REACTIVE METAL CATION SOLUTION |
| --- |
| 0.25 gram/liter of palladium chloride |
| 8% sulfuric acid by weight |
| 92% D.I. water by weight |

The image undergoes a replacement reaction of the copper with more stable cation, e.g., palladium. A more stable system is desired because of the tendency of the copper to oxidize at such thin layer amounts and because of the ability of the palladium to more rapidly initiate the reduction reaction in the electroless bath. The member is kept in this solution at least 30 seconds, and is subsequently washed in D.I. water for about 1 minute.

The catalyzed member is selectively electrolessly plated with one or more conductive metals to a deposition thickness of about 50–60 micro inches. Such metals include copper, nickel, gold, silver, platinum, cobalt, palladium, rhodium, aluminum and chromium. During the time in the electroless baths, the member is agitated with a rocking motion to promote diffusion of the metal to the innermost region of the substrate. Plating is carried out by first rinsing in deionized water, then dipping in an agitated electroless copper bath for a time sufficient to deposit copper in the material over the palladium and through the substrate thickness. Thus, within selected areas through the material in the Z axis direction, the material nodes 50 and fibrils 51 are at least partially covered with a conductive metal layer 56, having a Z-axis portion 57 and upper and lower contact pads 58 and 59. See FIG. 13. This the conductive metal 56 forms a continuous path of conductivity 24 through the selected areas between upper and lower pads 58 and 59.

If the Z-axis material is to be used as member 8, then it may be imbibed with an elastomer 60 which fills the previous designated pores 49. The elastomer can include any material that has elastomeric properties, such as, but not limited to siloxanes (silicon) based elastomers, acrylics, butyl rubbers, chlorosulfonated polyethylene, ethylene-propylene rubber, fluorinated elastomers, and thermoplastic rubbers including polystyrenes, polyethylenes, neoprenes, and polybutadiane. Preferably the elastomer is Dow Corning® 3–1753 which is, as supplied, a translucent liquid having a use range of −55° C. to 200° C., and at 25° C. has a specific gravity of 0.98 and a viscosity of 385 cps at 25° C. The conformal coating of Dow Corning® 3–1753 cures to a silicone elastomer that will not melt or appreciably soften. Other elastomers are Dow Corning® 3–1765, which as supplied, is translucent and at 25° C. has a specific gravity of 0.98 and a viscosity of 230 cps, and Dow Corning® 1–1405 which is translucent, and at 25° C. has a specific gravity of 0.98 and a viscosity of 450 cps.

An imbibing solution is prepared from non-adhesive silicone elastomers, such as, Dow Corning® 3–1753, 1–1405 and PSA 595 silicone from General Electric, in an appropriate solvent, such as octamethyltrisiloxane (05–20), methyl dimethylformamate (DMF), tetrahydrofuran (THF), mineral spirits, lower alcohols such as $C_1$–$C_6$ alcohols, preferably isopropanol, and ketones solvent from Dow Corning, where the elastomer comprises 10% to 70% by weight of the solution. The elastomer is thoroughly mixed and dissolved in the solvent to form an elastomer solution, by stirring or similar mixing techniques. The elastomer solution is placed in a tank or other suitable vessel and the selectively conductive Z-axis material is then immersed in the elastomer solution to imbibe or impregnate the solution into the pores of the material. Immersion can be by dipping. Although dipping is one impregnating technique, any other process capable of impregnating the Z-axis material with the elastomer solution, such as a pressurized spraying, may also be used.

The Z-axis material containing the elastomer solution is placed in a drying rack to air dry for 2 to 15 minutes, preferably 5 to 10 minutes, most preferably 5 minutes. The drying time is controlled by the pore size, material thickness and quantity of solvent. Longer or shorter periods of air drying may be necessary if thicker Z-axis materials are to be air dried or higher solvent quantities are present. Thereafter, the rack containing the air dried Z-axis impregnated material is placed in a heated oven, maintained at a temperature of between about 95° C. and 145° C., preferably about 120° C., for a period of time between 10 and 70 minutes, preferably 30 minutes to remove the solvent. The drying and heating is carried out until the residual solvent content is reduced to less than about 1.0% by weight, preferably 0.2% by weight.

If on the other hand the Z-axis material is to be used for the laminated wafer level contact sheet 9, then the Z-axis material is imbibed with a bonding adhesive. The passageways of the Z-axis material can be filled with an adhesive if the material is to be used as a connector interface between two other conductive materials. Suitable adhesives include epoxy resin, acrylic resin, urethane resin, silicone resin, polyimide resin, cyanate ester resin, or the like. The adhesive is conveniently imbibed into the pores by immersing the member in a solution of the adhesive. For an epoxy resin, a suitable solvent is methylethylketone. Once the adhesive is imbibed or impregnated into the Z-axis material in order to provide bonding capability it is baked at 160° C. which partially cures the adhesive.

Z-axis Materials Examples

In the following examples, the prepared catalytic treating solution used was prepared by adding to one liter of D.I. water:

| COMPONENT | AMOUNT (gms) | |
|---|---|---|
| 2,6 di-sodium anthraquinone di-sulfonic salt | 30 | |
| 2,7 di-sodium anthraquinone di-sulfonic salt | | 30 |
| sorbitol | 220 | 220 |
| cupric acetate | 15 | 15 |
| cupric bromide | 0.5 | 0.5 |
| olin G-10 surfactant | 2 | 2 |
| fluoroboric acid | pH 3.5–3.8 | |

The fixing solution used was 8% sulfuric acid by weight, 92% distilled water by weight. A stabilizing solution is also used, and contains the following components.

| STABILIZING SOLUTION |
|---|
| 0.25 g/l palladium chloride |
| 8% sulfuric acid by weight |
| 92% distilled water by weight |

EXAMPLE 9

As taught in the '467 patent, a stretched porous polytetrafluoroethylene membrane obtained from W. L. Gore & Associates was treated with a wetting agent by immersing it in a solution of 75% methanol, 25% ethanol and of 1 weight % copolymer of tetrafluoroethylene and vinyl alcohol at room temperature for about 30 seconds.

The wetted membrane was then dipped into the catalytic treating solution for 60 seconds and was then dried in an oven at 50° C. for 3 minutes. One surface of the membrane was then masked with dots of a diazo film of 6 mil diameters and 6 mil pitch (center to center).

The membrane was then exposed to a collimated UV light source at 1600 millijoule for about 2 minutes. After a 5 minute normalization period, the UV treated membrane was then washed for 30 seconds in the fixing solution to eliminate unexposed catalytic treating solution. The selectively imaged membrane was then stabilized by dipping into the stabilizing solution for one minute and then washing in distilled water for one minute.

The stabilized membrane was then dipped into a copper plating bath composition (Shipleys 3) on a per liter of D.I. water basis,

| PLATING SOLUTION |
|---|
| 30 grams of ethylenediamine tetra acetic acid |
| 6 to 8 grams sodium hydroxide |
| 5 to 7 grams copper II sulfate |
| 2 to 3 grams formaldehyde |
| 2 grams of a given surfactant |

The membrane was agitated in the bath using an agitation bar for 7 ½ minutes to promote diffusion of copper throughout the pores of the membrane in the catalyzed portion throughout in the Z-axis.

EXAMPLE 10

As taught in the '467 patent, a 6 mil (150 micrometer) thick, stretched, porous polytetrafluoroethylene membrane was wetted by subjecting it to 2 propanol by dipping for 1 minute. It was then dipped into the catalytic treating solution for one minute, dried, masked and subjected to UV light, and then subjected to the fixing and to the stabilizing solution as in Example 9. The Z-axis material was plated with copper as in Example 9 and coated with copper, as in Example 9.

EXAMPLE 11

A 2 mil thick stretched porous polytetrafluoroethylene membrane was prepared as in Example 9, except that the masking strips were 3 mil pad with a 10 mil pitch.

EXAMPLES 12–14

The procedure of Example 9 was followed for membranes formed from porous polyethylene, porous polypropylene and open cell, porous polyurethanes to produce a Z-axis material having irregularly shaped conductive pathways that extend along the Z-axis.

Elastomeric Selectively Conductive Z-axis Material

EXAMPLE 15

The Z-axis material of Example 9 was imbibed with the following solution:

| ELASTOMER SOLUTION |
| --- |
| 22 gms of Silicone 3-1765 (Dow Corning) |
| 78 gms OS-20 solvent (Dow Corning) | by placing the solution in a tank and dipping the Z-axis material, which IS supported on a frame, into the solution. The impregnated Z-axis material was air dried for 5 minutes in a drying rack. The drying rack was placed in an oven that was heated to 120° C. for 30 minutes to remove solvent.

In Examples 16–20 below, the Z-axis material is impregnated with a silicone elastomer. However, the Z-axis material is also used without the elastomer.

EXAMPLE 16

Figure 17:
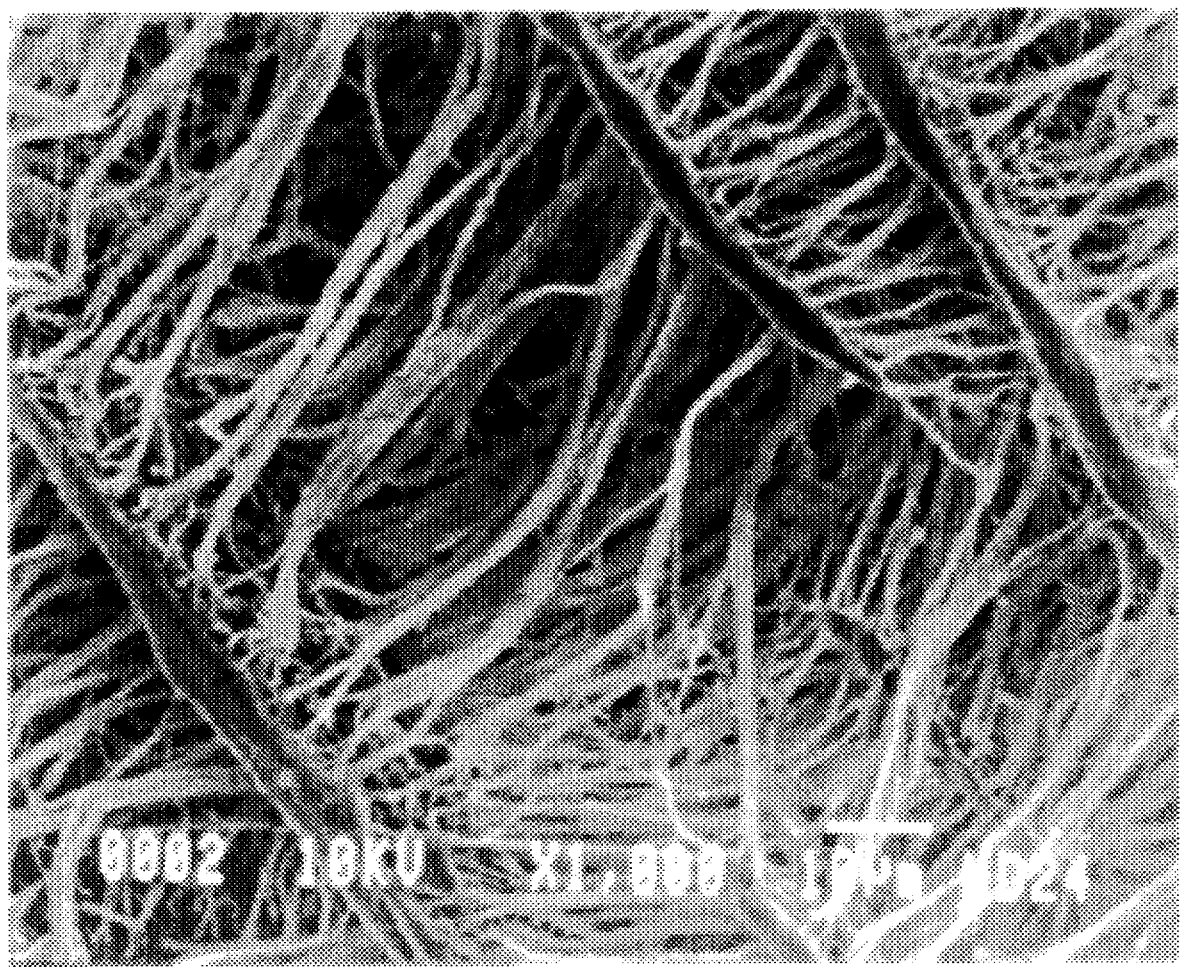
FIG. 17 is a scanning electron micrograph of an ePTFE material that is used to prepare a Z-axis material which has a density of 0.20 gm/cm$^3$, a thickness of 150 µm and an 70% air void volume.

A membrane formed from a stretched porous polytetrafluoroethylene membrane having the node-fibril structure shown in FIG. 17 (1000×magnification) is 76 µm thick with a density of 0.22 gm/cm$^3$ and an air volume of 70% at 25° C., and is available from W. L. Gore & Associates, was prepared as in Example 1 to form a Z-axis membrane, except that the masking strips were 2 mil pad with a 5 mil pitch. The Z-axis membrane was impregnated with a silicone solution containing 20% Dow Corning® 3-1753 silicone.

EXAMPLE 17

Figure 14:
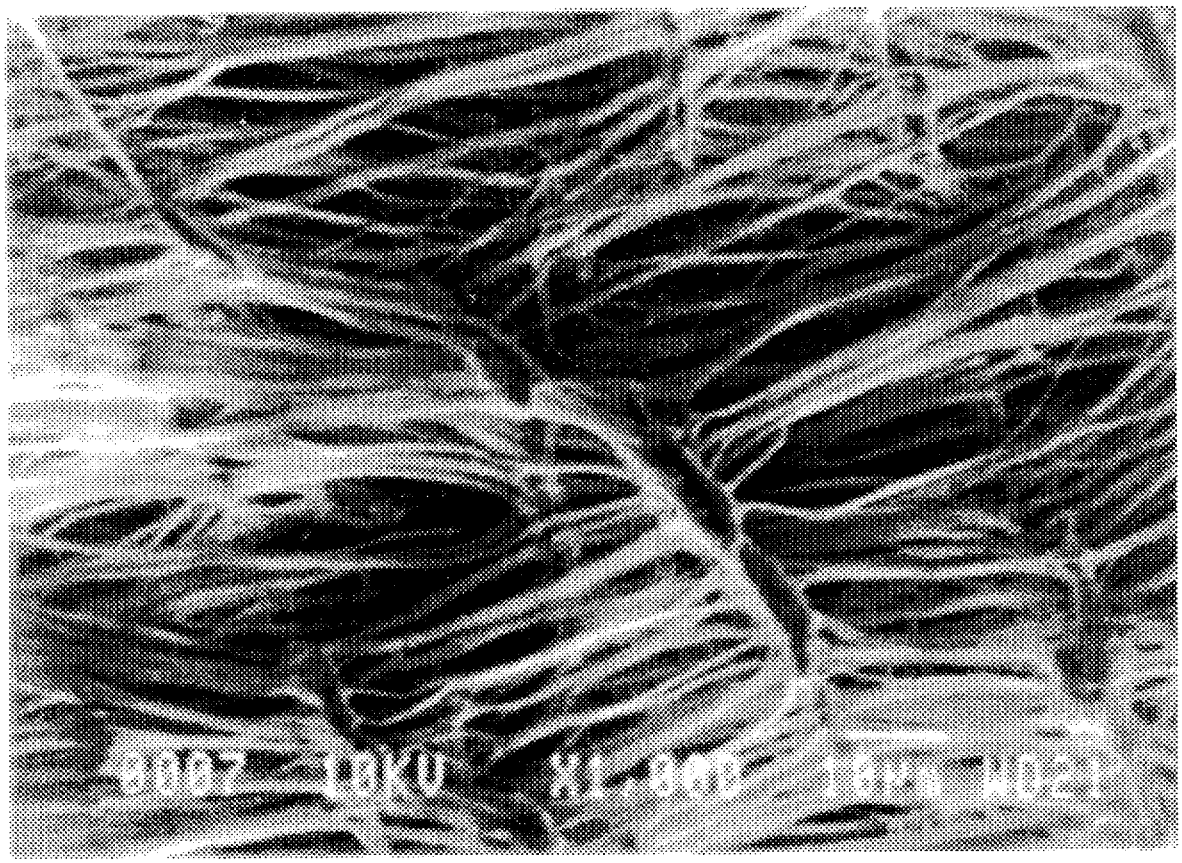
FIGS. 14 is a scanning electron micrograph of ePTFE material that is used to prepare a Z-axis material which has a density of 0.22 gM/cm$^3$, a thickness of 76 µm and an air void volume of 70%.

A polytetrafluoroethylene membrane similar to that of Example 16 having the node-fibril structure in FIG. 14 (1000×magnification), was prepared as in Example 1 to form a Z-axis membrane, except that the masking strips were 8 mils with a 15 mil pitch. The Z-axis membrane was impregnated with a silicone solution containing 30% Dow Corning® 3-1753 silicone.

EXAMPLE 18

Figure 15:
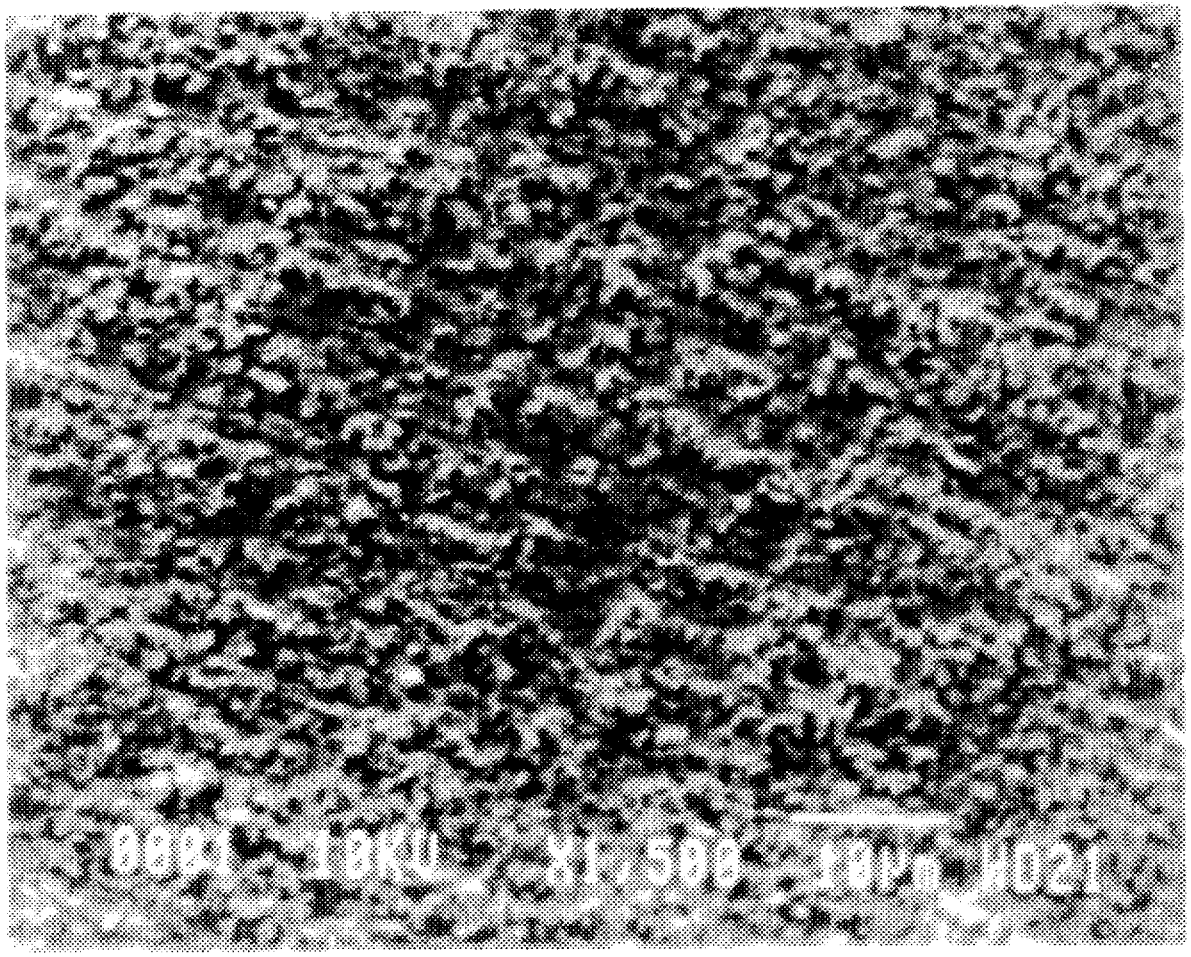
FIG. 15 is a scanning electron micrograph of an ePTFE material that is used to prepare a Z-axis material which has a density of 0.40 gm/cm$^3$, a thickness of 40 µm and a 20% air void volume.

A stretched porous polytetrafluoroethylene membrane with the node-fibril structure shown in FIG. 15 (1500× magnification) that is 40 µm thick, with a density 0.4 g/cm$^3$ and an air volume of 20% at 25° C., available from W. L. Gore & Associates, was prepared as in Example 1 to form a Z-axis membrane, except that the masking strips were 8 mils with a 15 mil pitch. The Z-axis membrane was impregnated with a silicone solution containing 30% Dow Corning® 3-1753 silicone.

EXAMPLE 19

Figure 16:
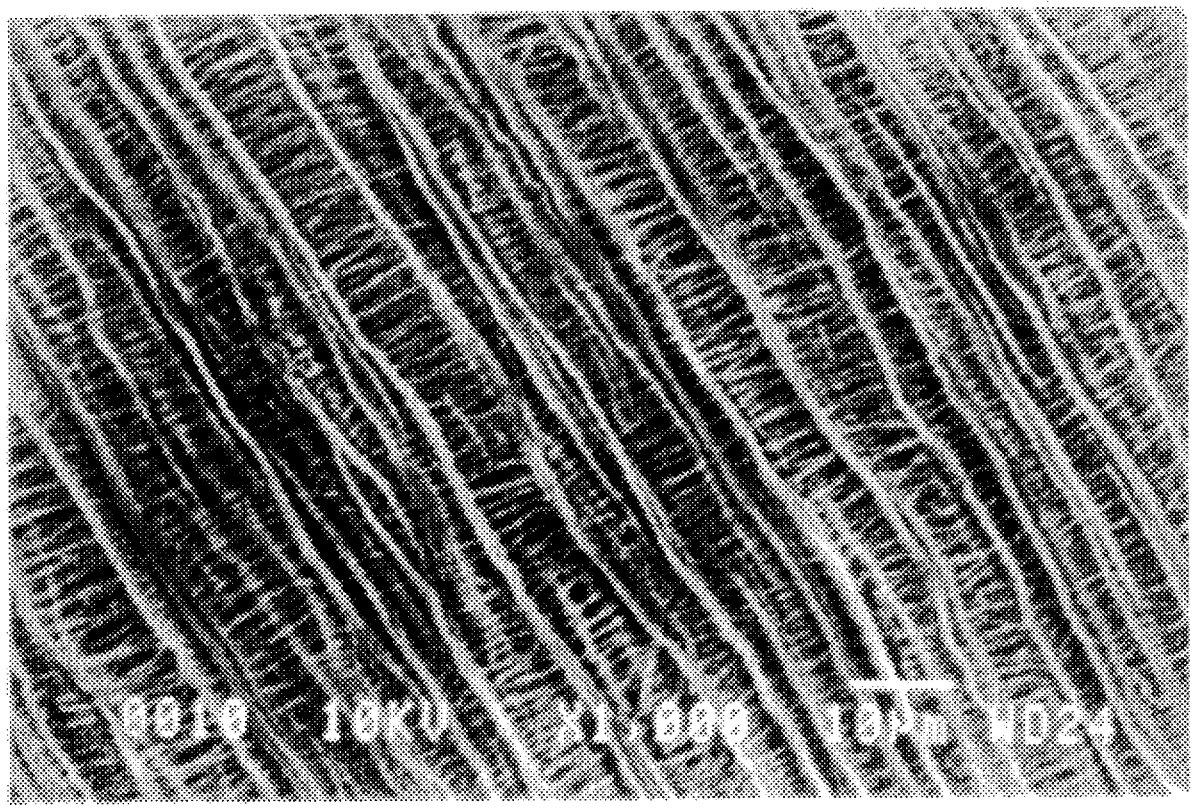
FIG. 16 is a scanning electron micrograph of an ePTFE material that is used to prepare a Z-axis material which has a density of 0.35 gm/cm$^3$, a of thickness 100 µm and a 70% air void volume.

A stretched porous polytetrafluoroethylene membrane with the node-fibril structure of FIG. 16 (1000× magnification) that is 100 µm thick, with a density of 0.35 gm/cm$^3$ and an air volume of 70% at 25° C., available from W. L. Gore & Associates, was prepared as in Example 1 to form a Z-axis membrane, except that the masking strips were 8 mils with a pitch of 15 mils. The Z-axis membrane was impregnated with a silicone solution containing 30% Dow Corning® 3-1753 silicone.

EXAMPLE 20

A stretched porous polytetrafluoroethylene membrane with the node-fibril structure of FIG. 17 (1000× magnification) is 150 µm thick, with a density of 0.20 gm/cm$^3$ and an air volume of 70% at 25° C., and which is available from W. L. Gore & Associates, was prepared as in Example 1 to form a Z-axis membrane, except that the masking strips were 8 mils with a 15 mil pitch. The Z-axis membrane was impregnated with a silicone solution containing 30% Dow Corning® 3-1765 silicone.

EXAMPLES 21–23

The Z-axis substrate membrane of Examples 9–11 above, are impregnated with an epoxy adhesive in order to provide bonding capability and baked at 160° C.

EXAMPLES 24–29

The Z-axis materials of Examples 15–20 respectively, which form the matrix for the elastomer, are contacted in their unimpregnated state with an expoxy adhesive resin and heated to 160° C. to form a Z-axis adhesive material.

Figure 18:
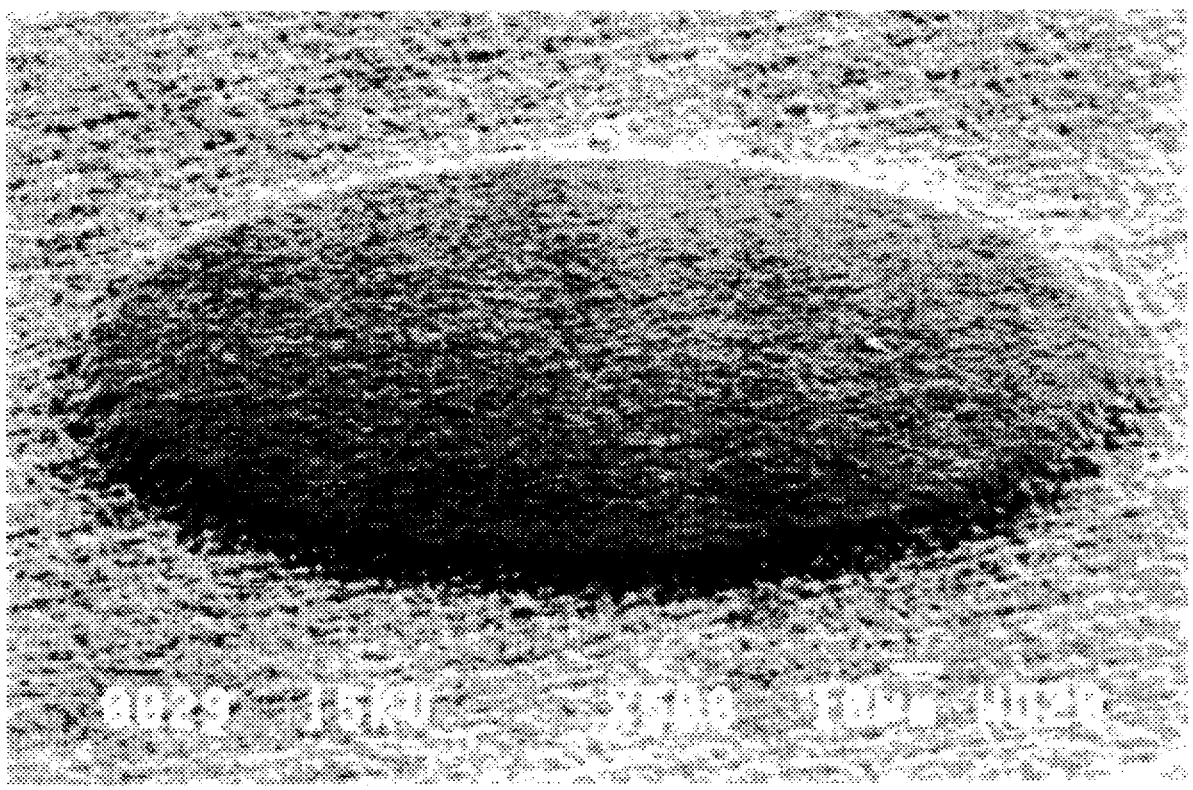
FIG. 18 shows an 8 mil pad on a Z-axis material.
Figure 19:
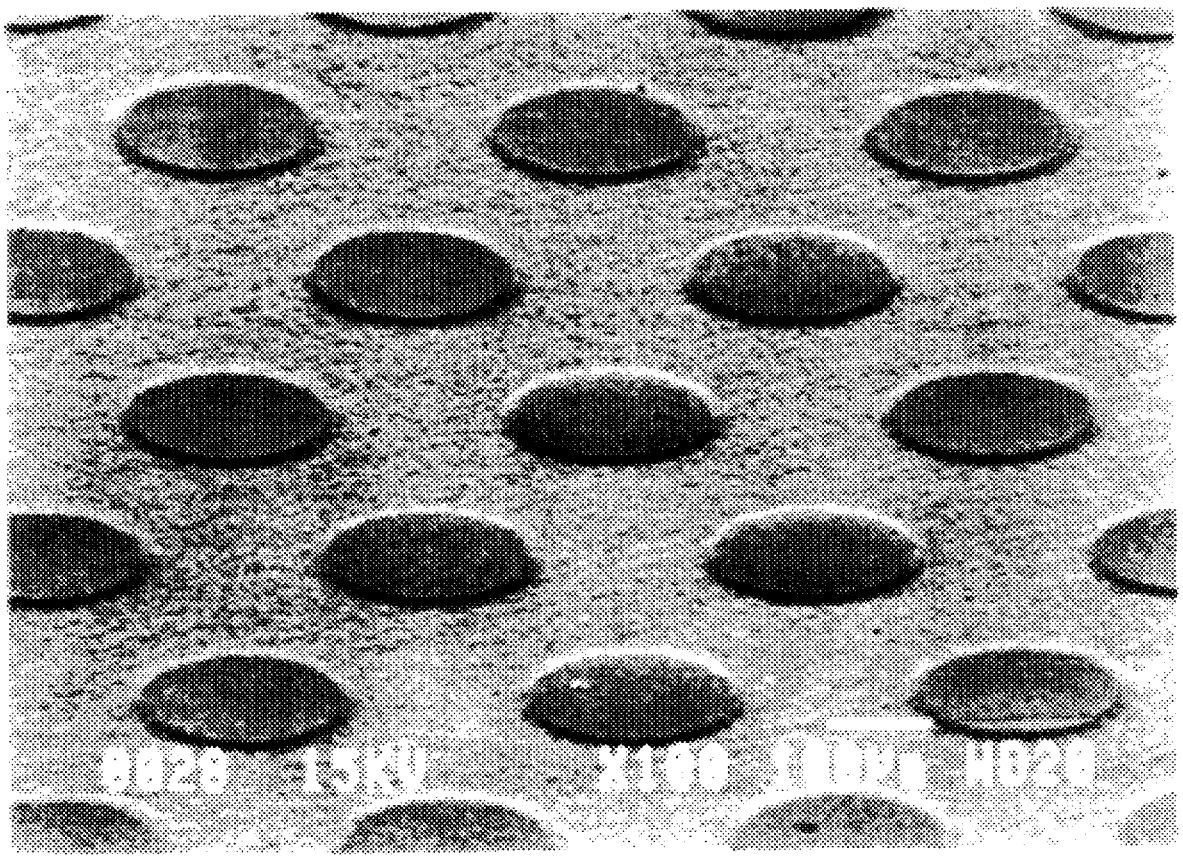
FIG. 19 shows an array of 8 mil pads with a 15 mil pitch on a Z-axis material.

FIGS. 18 and 19 are scanning electro/micrographs of an 8 mil pad and 8 mil pads with a 15 mil pitch respectively.

Laminated Wafer Level Contact Sheet

The laminated wafer level contact sheet 9 will be described with reference to FIGS. 20–34 and has an upper surface 8 with contact pads (FIG. 34) arranged in a pattern corresponding to the first terminals 13 of the base unit and raised conductive metallic bumps on a lower surface. Each of the contact pads is electrically coupled to the conductive bumps on the lower surface of the laminated wafer level contact sheet 9. When the burn-in device is in use, the conductive bumps make contact with the contact pads of the wafer under test.

As seen in FIG. 34, the laminated wafer level contact sheet includes first 61 and second layers 62. The first layer 61 is formed from a dielectric material 63 with at least one conductive via 64 formed in one surface 65 respectively coupled to a conductive pad 66 on the other surface. These layers form the substrate that is processed to form the part of the wafer level contact sheet. The first layer 61 is a substrate 67, preferably Goreflex®, available from W. L. Gore and Associates, Inc. Instead of Goreflex®, a dielectric material 63, is formed from Speedboard C® or an adhesive-filler-ePTFE composite, and clad with copper.

The second layer 62 is formed from a porous, Z-axis material having a series of electrically isolated, irregularly shaped conductive, Z-axis pathways with a conductive metal bump or contact on a lower surface of said second layer. The conductive bump 67 is coupled to the conductive pads 66 on the first layer 61 through a blind via 64 and the irregularly shaped, conductive Z-axis pathways in the adhesive containing Z-axis material.

Figure 20:
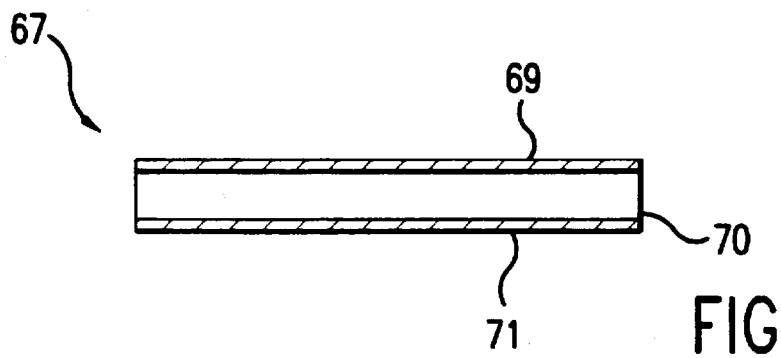
FIGS. 20–34 depict the process sequence for forming the laminated wafer level contact sheet of the present invention.
Figure 23:
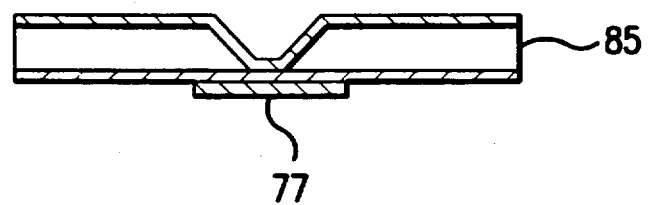
Figure 24:
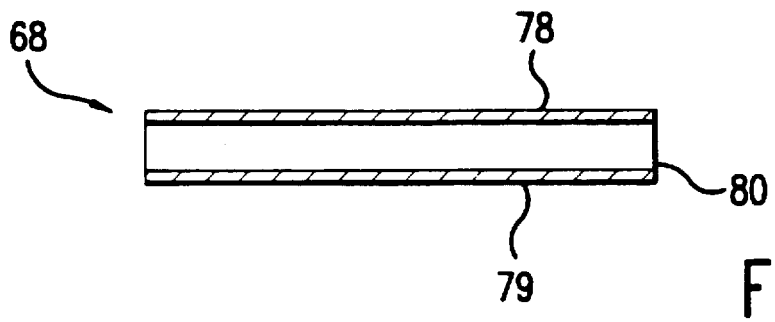

As seen in FIGS. 20–34, the laminated wafer level contact sheet of FIG. 34 is manufactured from first and second dielectric laminate substrates 67 and 68 of FIGS. 20 and 24 respectively. Each dielectric is laminated with upper and lower copper layers (FIG. 20).

Substrate 67 includes a conductive layer 69 (such as copper, for example), a dielectric layer 70 formed from Speedboard C®k or an adhesive paste ePTFE composite, and a conductive layer 71 (such as copper, for example). The dielectric layer 70 should not contain a material which is resistant to etching by a laser or plasma process, such as a glass reinforced dielectric layer. Suitable dielectric materials include, but are not limited to polyimides and polyimide laminates, epoxy resins, organic materials, or dielectric materials comprised at least in part of polytetrafluoroethylene. One dielectric material may be obtained from W. L. Gore & Associates, Inc. under the tradename SPEEDBOARD® dielectric material or the adhesive-SiO₂ filled porous substrates described above.

The thickness of the dielectric layer 70 is important. This thickness will define the height of the resulting metallic contacts. A photoresist is applied to copper layers 69 and 71, respectively and imaged where a well, e.g., a depression or via is to be formed. Copper in an exposed (imaged) area (not shown) is etched away by any suitable conventional copper etchant, such as a cupric chloride based etchant solution. After the copper within the exposed area is etched away a portion of dielectric layer 70 is visible. The photoresist may then be removed from the substrate.

Figure 21:
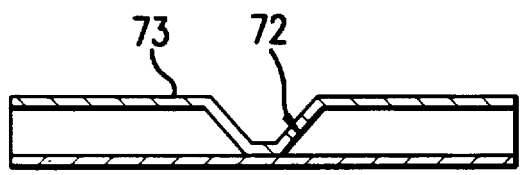

The exposed dielectric portion is ablated away with a laser to define a "well" 72 into which a metallic contact will be formed (FIG. 21). As should be understood, the copper layer 69 functions as a mask to permit ablation of the exposed dielectric portion 70. The copper layer 71 acts as a stop and will define the bottom of the well 72. The ablation of the exposed dielectric portion may be accomplished by any laser suitable for selective ablation of organic dielectrics, without removing a copper layer. Lasers which operate in ultra violet wavelengths are particularly well suited, such as excimer lasers, and frequency tripled or quadrupled YAG lasers. However, other types of lasers are also suitable. The laser may be operated either in a scanning mode, in which the surface of the substrate is swept with a large laser spot, or in a focused beam. In addition to laser ablation of the exposed dielectric portion, other processes may be employed to selectively remove the exposed dielectric portion, such as but not limited to plasma etching, reactive ion etching, or chemical etching. However, a laser ablation process is particularly well suited, as it permits more control over the shape of the well. Simple diffraction will provide a tapered conical shape in the case of scanning mode laser ablation process.

As a result, a blind via 72 is formed. Thereafter the inside of the well or via 72 is coated with a conductive metal 73, such as copper. Copper may be deposited by any suitable technique, such as, electroless plating, sputtering, evaporation, or deposition of a conductive coating which allows direct electrodeposition.

Figure 22:
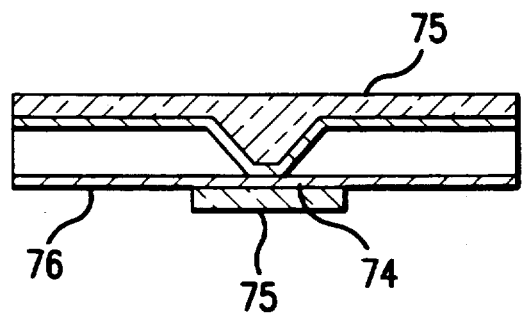

Thereafter, the entire top of the substrate 67, as well as, a prospective pad area 74 is coated with a photoresist 75 (FIG. 22). The exposed copper 76 on the bottom of substrate 67 is etched away by any suitable conventional copper etchant, such as a cupric chloride based etchant solution. The photoresist 75 is then removed from the top and bottom surfaces of the substrate leaving copper pad 77 (FIG. 23). Optionally, a first nickel layer and a second gold layer can be deposited on the outer surface of pad 77, with the nickel layer functioning to reduce diffusion of the gold layer into the copper layer.

The second dielectric laminate substrate 68 (FIG. 24) is identical to substrate 67 and includes, an upper copper layer 78, a dielectric 80 and a lower copper layer 79. As with substrate 67, the dielectric layer 80 must not comprise a material which is resistant to etching by a laser or plasma process, such as a glass reinforced dielectric layer.

Figure 25:
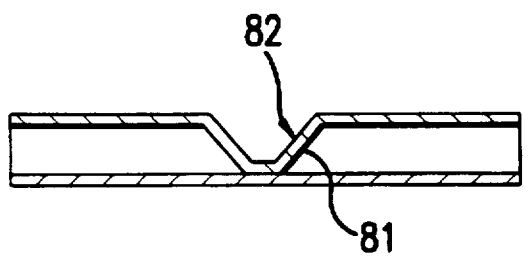

Again, a photoresist is applied to copper layers 78 and 79 (not shown), respectively, and the area where a well, depression or via 81 is to be formed is imaged using conventional techniques. Copper layer 78 in the imaged and exposed area (not shown) is etched away by any suitable conventional copper etchant, such as a cupric chloride based etchant solution. After the copper within the exposed area is etched, an exposed portion of dielectric layer 80 is visible and ablated away with a laser to define a "well" 81 (FIG. 25). After the well or via 81 has been defined, the base substrate is processed in any suitable manner which deposits a surface conductive layer 82, such as copper, on the side walls of the well or via 81 as discuss above with reference to substrate 67. Photoresist 83 is then applied to the top of the substrate 68 (FIG. 26) and imaged to form pads and/or traces, as well as on the bottom of substrate 68 to avoid plating or metallization.

Figure 27:
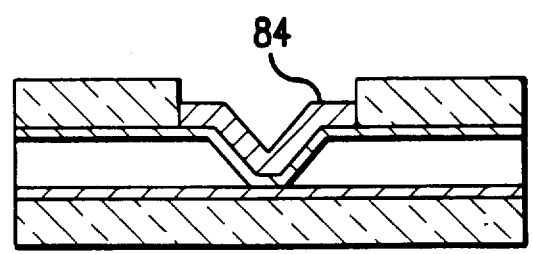
Figure 28:
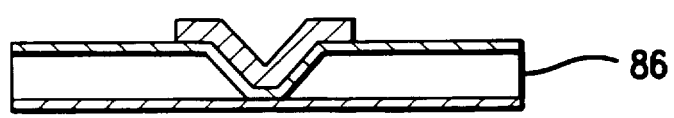

Areas not protected by the photoresist are metallized with a metal that has etch selectivity to the copper, such as, nickel and form a nickel layer 84 (FIG. 27). Thereafter, the deposited nickel may be coated with a layer of gold for forming a low resistance contact. The photoresist is then removed from the upper and lower surfaces of substrate (FIG. 28).

Figure 29:
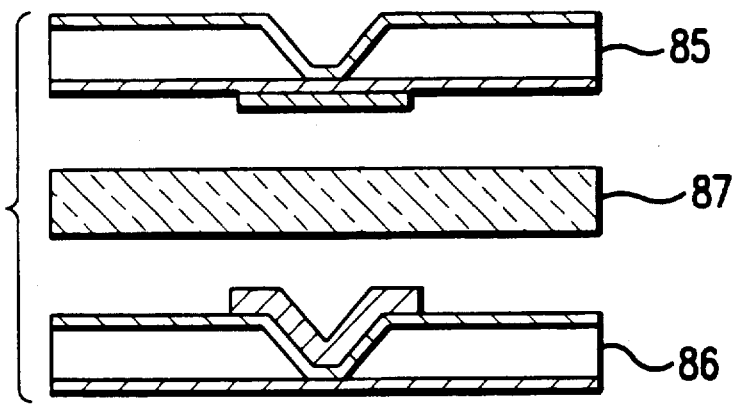
Figure 30:
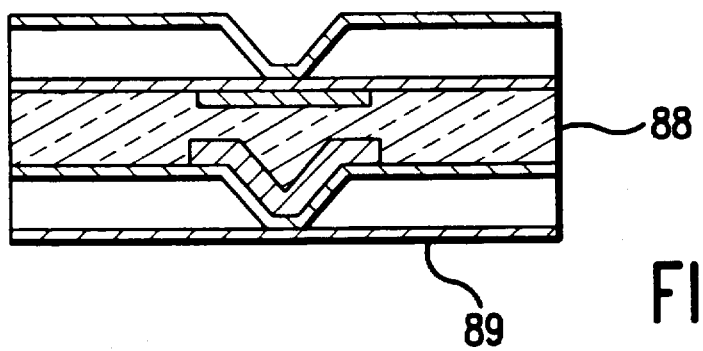
Figure 31:
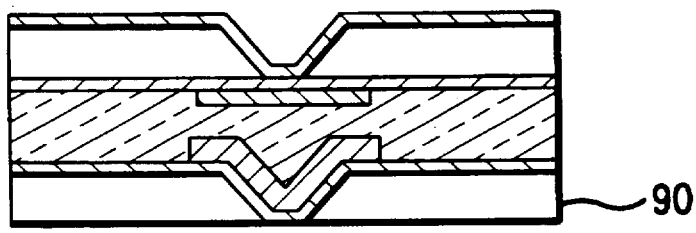

The laminated wafer level contact sheet is then assembled by locating a selectively conductive Z-axis material 87 between said processed first and second dielectric laminate substrates 85 and 86, with process substrate 85 being on top of said Z-axis material 87 (FIG. 29). The three layers are laminated together under temperature 435 F. and pressure 325 psi whereby an adhesive in said Z-axis material 87 bonds substrates 85 and 86 thereto.

Figure 32:
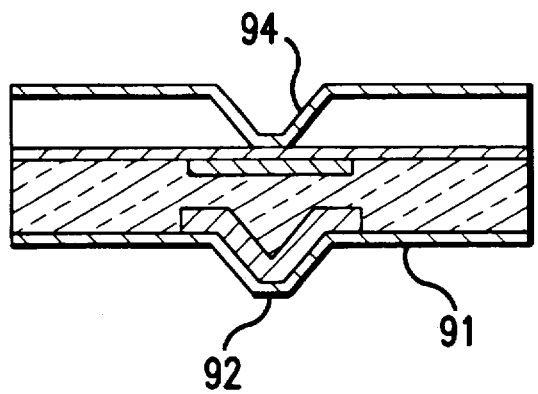
Figure 33:
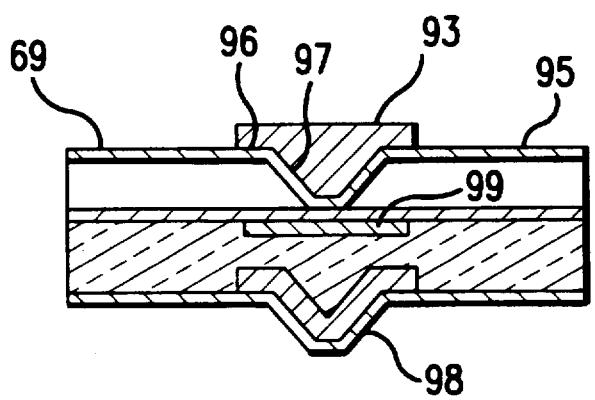

After the three layer unit 88 is formed (FIG. 30), copper layer 89 is etched away using a copper etching solution discussed above, leaving layer 90 (FIG. 31). Thereafter, the dielectric 90 is removed leaving copper layer 91 having a bump 92 (FIG. 32). Photoresist 93 is then applied to the via 94 and surrounding areas 96 and 97 on the processed substrate (FIG. 33) and copper layer 98 and exposed copper layer 95 removed (FIG. 34). The photoresist is removed and the wafer level contact sheet is formed. The conductive via 94 is coupled to the conductive pad 99 which is then coupled to the bump 67 through the conductive Z-axis pathways in the Z-axis material 87.

Suitable processes for forming the metal coating on the via include, but are not limited to a conventional electroless copper plating operation, sputtering, evaporation, or deposition of a conductive coating which allows direct electrodeposition, or any other suitable process. Additional electrolytically deposited copper may be added to thicken this deposit, thereby providing a more robust surface for additional process steps.

FIG. 35 is a scanning electron micrograph of a bump formed on the wafer level contact sheet according to the procedure described above.

Figure 26:
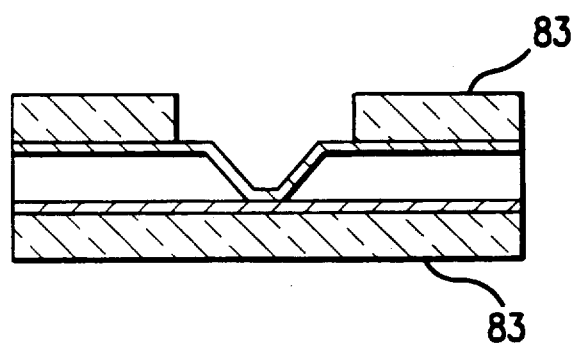
Figure 36:
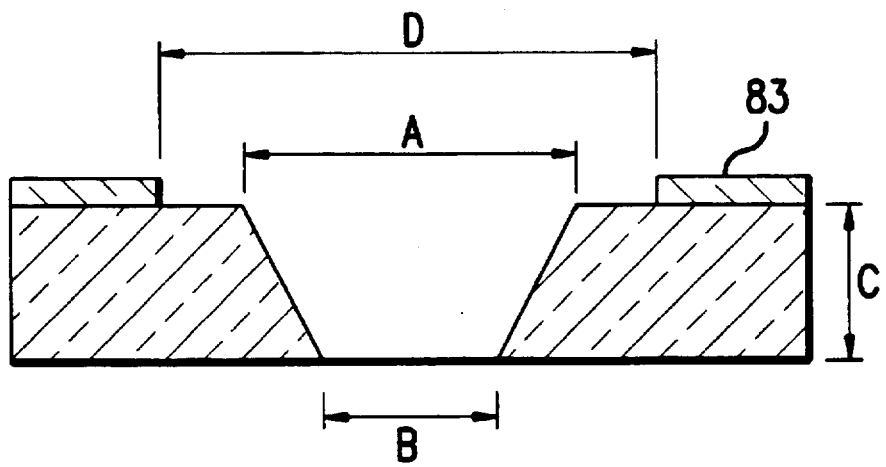
FIG. 36 shows an enlarged view of the via and surrounding photoresist for form a conductive bump on the wafer level contact sheet of the present invention.
Figure 37:
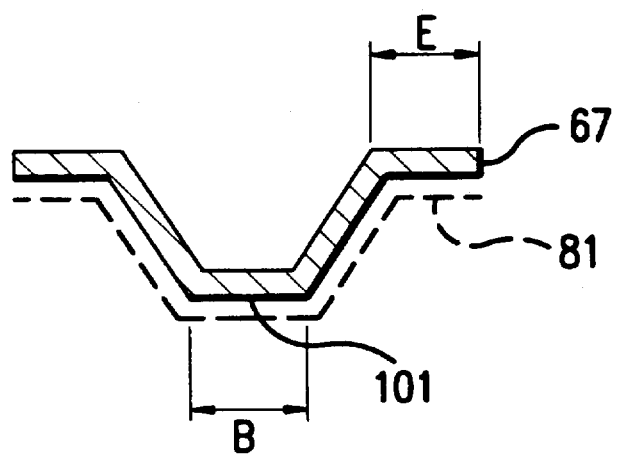
FIG. 37 shows an isolated conductive bump and its dimensions.
Figure 38:
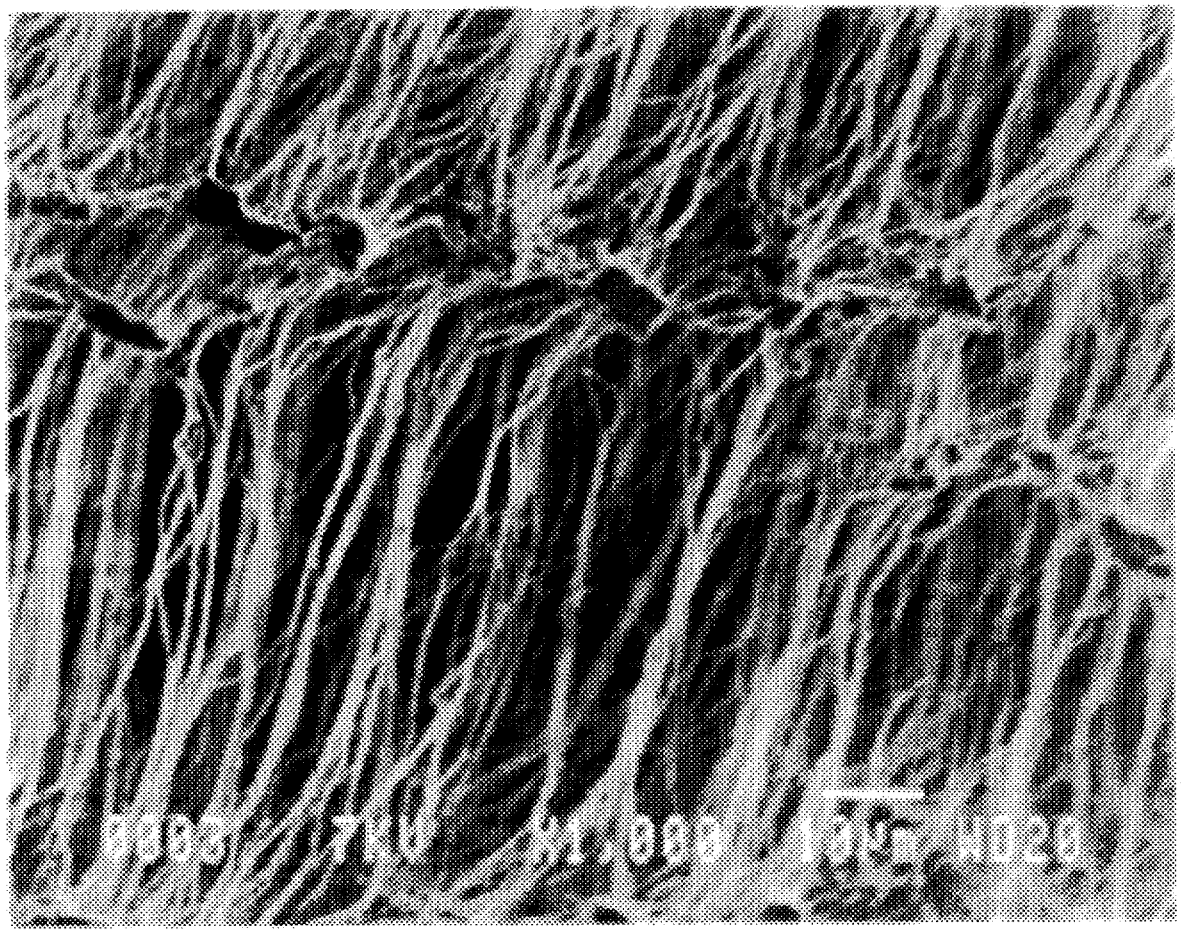
FIG. 38 shows a scanning electron micrograph of an ePTFE material used for preparing an adhesive-filler composite.

In FIG. 36, the substrate of FIG. 26 is slightly enlarged to provide the dimensions of the via and pad surface that is formed to provide the conductive bump. As seen in FIG. 36, the via has an upper diameter A, where A is between 25 μm and 75 μm, a bottom diameter B, where B is between 10 μm and 60 μm, and a height C, where C is between 20 μm and 75 μm. The diameter D of the pad that is formed from photoresist 83, is between 35 μm and 150 μm. The bump 67, shown in FIGS. 34 and 37, has a substantially planar tip 101, having an end diameter of between 5 μm and 50 μm, with a tolerance of ±2 μm, which is temporarily supported by the via 81.

While preferred embodiments have been shown and described, it will be understood that it is not intended to limit the disclosure, but rather it is intended to cover all modifications within the spirit and scope of the invention as defined in the appended claims or their equivalents.

We claim:

1. A method of burn-in screening of electronic components comprising:

providing a burn-in apparatus having a high planarity base unit, a compliant z-axis, selectively conductive layer, and a laminated wafer contact sheet, said high planarity base unit having downwardly depending first and second conductive terminals and a CTE that substantially matches a CTE of an electronic component to be screened, said compliant z-axis, selectively conductive layer including z-axis conductive pathways therethrough, said laminated wafer contact sheet including z-axis conductive pathways terminating in conductive bumps;

positioning the burn-in apparatus in an environment wherein the temperature of the electronic component to be screened is controlled;

positioning said compliant z-axis, selectively conductive layer between said high planarity base unit and said laminated wafer contact sheet;

positioning said burn-in apparatus in electrical contact with said electronic component to be screened; and generating a test signal and conveying said test signal through said first and second terminals, said z-axis, selectively conductive layer, and said laminated wafer contact sheet to said electronic component to be screened.

2. The method according to claim 1, wherein said burn-in screening is conducted at a temperature of at least about 90° C.

3. The method according to claim 1, wherein said burn-in screening is conducted at a temperature of at least about 150° C.

4. The method according to claim 1, wherein said burn-in screening is conducted at a temperature between about 125° C. and 200° C.

5. The method according to claim 1, comprising conveying said test signal to a semiconductor wafer which contains the electronic component.

6. The method according to claim 5, comprising burn-in screening semiconductor wafers that are between about 75 mm and 300 mm in diameter.

7. The method according to claim 5, comprising burn-in screening semiconductor wafers between about 150 mm and 200 mm in diameter.

8. The method according to claim 5, comprising burn-in screening semiconductor wafers between about 200 mm and 300 mm in diameter.

9. The method according to claim 1, further including providing the high planarity base unit with lower circuitry layers which contain said first and second terminals on a lower surface thereof and balancing layers on its upper surface.

10. The method according to claim 9, comprising providing a stack of balancing layers, each balancing layer including a conductive layer and a dielectric layer having a density substantially matching a density of a corresponding circuitry layer of said high planarity base unit.

11. The method according to claim 1, further including the step of providing said high planarity base unit with a coefficient of thermal expansion that matches the coefficient of thermal expansion of the electronic component to be screened ±3ppm ° C.

* * * * *